(12) United States Patent
Watanabe et al.

(10) Patent No.: US 9,555,632 B2
(45) Date of Patent: Jan. 31, 2017

(54) METHOD OF PROCESSING A SILICON SUBSTRATE AND METHOD OF MANUFACTURING A SUBSTRATE FOR A LIQUID EJECTION HEAD

(71) Applicant: CANON KABUSHIKI KAISHA, Tokyo (JP)

(72) Inventors: Makoto Watanabe, Yokohama (JP); Yoshinori Tagawa, Yokohama (JP); Hiroyuki Murayama, Yokohama (JP); Shuhei Oya, Kawasaki (JP); Takanobu Manabe, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/160,350

(22) Filed: May 20, 2016

(65) Prior Publication Data
US 2016/0375687 A1    Dec. 29, 2016

(30) Foreign Application Priority Data
Jun. 26, 2015    (JP) .................... 2015-128627

(51) Int. Cl.
*H01L 21/02* (2006.01)
*B41J 2/16* (2006.01)
*H01L 21/306* (2006.01)

(52) U.S. Cl.
CPC .............. *B41J 2/1626* (2013.01); *B41J 2/162* (2013.01); *H01L 21/02019* (2013.01); *H01L 21/30608* (2013.01)

(58) Field of Classification Search
CPC ............... H01L 21/02016; H01L 21/02035; H01L 21/02296; H01L 21/46; H01L 21/461; H01L 21/467
See application file for complete search history.

(56) References Cited

U.S. PATENT DOCUMENTS

| 7,824,560 B2 | 11/2010 | Sakai et al. |
| 8,057,017 B2 | 11/2011 | Sakai et al. |
| 8,329,047 B2 | 12/2012 | Nagami et al. |

FOREIGN PATENT DOCUMENTS

| JP | 2007-269016 A | 10/2007 |
| JP | 2010-142972 A | 7/2010 |

*Primary Examiner* — Cheung Lee
(74) *Attorney, Agent, or Firm* — Fitzpatrick, Cella, Harper & Scinto

(57) ABSTRACT

Performed are a non-through hole forming step of partitioning a supply path forming region of a second surface into a first region corresponding to a forming position of a beam, a second region located adjacent to the first region on both sides thereof, and a third region that is none of the first region and the second region, and forming a plurality of non-through holes in the second region and the third region, and an etching step of subjecting a silicon substrate to anisotropic etching from the second surface, to thereby form the supply path and the beam in the supply path. In the non-through hole forming step, at least one of an interval or a depth of the non-through holes is caused to differ in the second region and the third region, to thereby control the shape and dimension of the beam to be formed in the etching step.

16 Claims, 21 Drawing Sheets

METHOD OF PROCESSING A SILICON SUBSTRATE AND METHOD OF MANUFACTURING A SUBSTRATE FOR A LIQUID EJECTION HEAD

BACKGROUND OF THE INVENTION

Field of the Invention

The present invention relates to a method of processing a silicon substrate and a method of manufacturing a substrate for a liquid ejection head using the processing method.

Description of the Related Art

A liquid ejection head is configured to eject a liquid from an ejection orifice to cause the liquid to land on an object, e.g., a recording medium, to thereby record, for example, an image onto the object. As an example of the liquid ejection head, there is given an ink jet recording head configured to perform recording by ejecting ink onto a recording medium, e.g., paper. The liquid ejection head generally includes a plurality of ejection orifices provided in an ejection orifice forming member so as to eject a liquid, a flow path communicating to each ejection orifice, and a substrate including at least energy generating elements configured to apply ejection energy to the liquid in the flow path (hereinafter referred to as "substrate for a liquid ejection head"). The ejection orifice forming member is provided on the substrate so that the flow path is formed between the ejection orifice forming member and the surface of the substrate. Further, a supply path for supplying the liquid to the flow path is provided in the substrate so as to penetrate therethrough. In general, as the substrate for a liquid ejection head, a silicon substrate formed of silicon is used.

The substrate for a liquid ejection head is a member for supporting the ejection orifice forming member and is required to have high strength from the viewpoint of reliability. As one of procedures for enhancing mechanical strength of the substrate, there is given a procedure involving forming a beam in the supply path. For example, in Japanese Patent Application Laid-Open No. 2010-142972, there is disclosed a method of manufacturing an ink jet recording head including a beam formed so as to connect opposed long sides of a supply path. In beam formation in the manufacturing method disclosed in Japanese Patent Application Laid-Open No. 2010-142972, first, a sacrificial layer to be isotropically etched with an alkaline solution is formed on one surface side of a silicon substrate, and then an etching mask layer is formed on the other surface side of the silicon substrate. After that, the silicon substrate is subjected to anisotropic etching with an alkaline solution, so that a beam is formed in the supply path.

Further, as a method of stably manufacturing a substrate to be used in a liquid ejection head with high production efficiency, there is given a method disclosed in Japanese Patent Application Laid-Open No. 2007-269016. In the method disclosed in Japanese Patent Application Laid-Open No. 2007-269016, a supply path is formed, for example, by forming a non-through hole in a silicon substrate by laser processing and then performing anisotropic etching. Specifically, first, an etching mask layer having an opening corresponding to a portion in which a supply path is to be formed is formed on one surface of a silicon substrate. Then, at least two rows of non-through holes along an alignment direction of an ejection orifice row are disposed in the opening. After that, crystal anisotropic etching is performed to the opening to form a supply path.

SUMMARY OF THE INVENTION

According to one aspect of the present invention, there is provided a method of processing a silicon substrate, including forming a supply path in a silicon substrate having a first surface and a second surface on an opposite side of the first surface, the supply path penetrating the silicon substrate and including a beam configured to connect opposed sides of the supply path to each other, the method further including: a non-through hole forming step of partitioning, for each beam, a region of the second surface in which the supply path is to be formed, into a first region that corresponds to a forming position of the beam, a second region that is adjacent to the first region on both sides of the first region, and a third region that is none of the first region and the second region, and forming a plurality of non-through holes, which are prevented from penetrating the silicon substrate, in the second region and the third region from the second surface; and an etching step of subjecting the silicon substrate having the plurality of non-through holes formed therein, to anisotropic etching from the second surface, to thereby form the supply path and form the beam in the supply path at the same time, the non-through hole forming step comprising causing at least one of an interval or a depth of each of the plurality of non-through holes to differ in the second region and the third region.

According to another aspect of the present invention, there is provided a method of manufacturing a substrate for a liquid ejection head, including forming a substrate for a liquid ejection head by applying the method of processing a silicon substrate of the present invention described above to the silicon substrate having a plurality of energy generating elements formed on the second surface.

Further features of the present invention will become apparent from the following description of exemplary embodiments with reference to the attached drawings.

DESCRIPTION OF THE EMBODIMENTS

Figure 1:
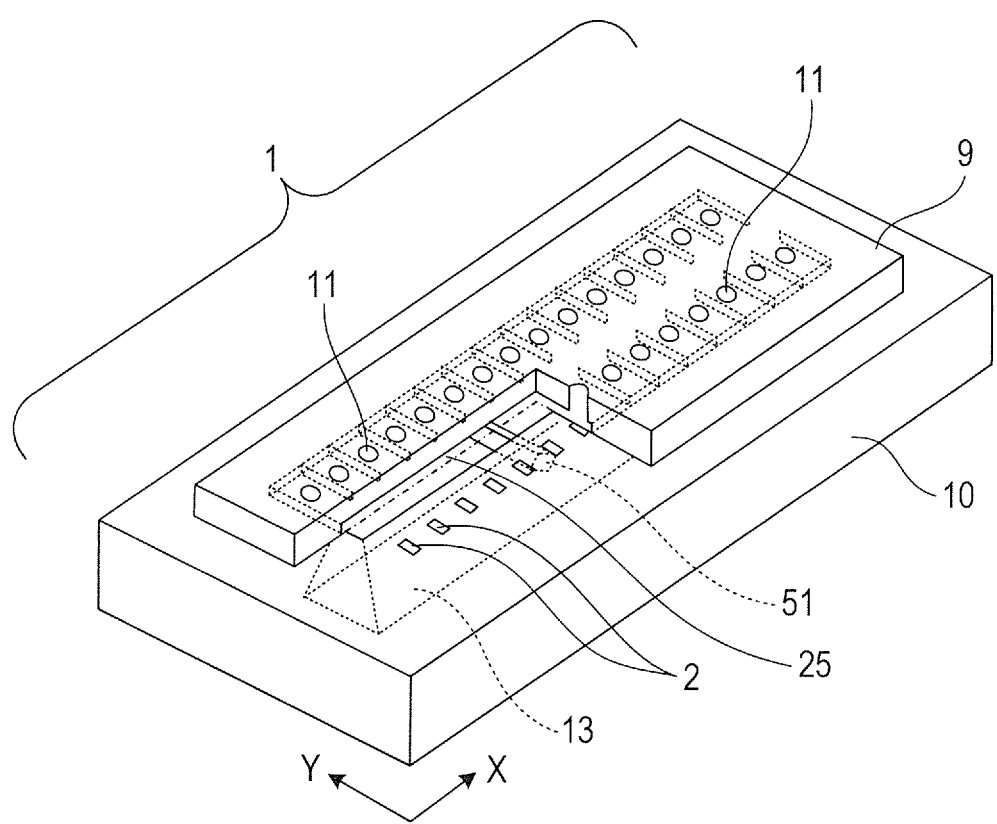
FIG. 1 is a partial cutaway schematic perspective view for illustrating a liquid ejection head.

In the method disclosed in Japanese Patent Application Laid-Open No. 2010-142972, the beam is formed in the supply path in order to enhance the strength of the substrate. The dimension of the beam is controlled by changing an etching time with the alkaline solution, a material and a pattern shape of the sacrificial layer to be formed on one surface of the silicon substrate, a material and a pattern shape of the etching mask layer to be formed on the other surface of the silicon substrate, and the like. Therefore, in the method disclosed in Japanese Patent Application Laid-Open No. 2010-142972, a plurality of steps, such as formation of the sacrificial layer, formation of the etching mask layer, and anisotropic etching, are required in order to form the beam, and further, it is necessary to accurately control the steps described above so as to control the dimension of the beam.

The present invention is directed to providing a processing method of forming in a silicon substrate a supply path including a beam therein, in which the dimension of the beam can be controlled by a simple method.

The present invention is also directed to providing a method of manufacturing a substrate for a liquid ejection head including a beam in a supply path, in which the dimension of the beam can be controlled by a simple method.

Embodiments of the present invention are described in detail below with reference to the drawings. In the following descriptions, configurations having the same function are denoted by the same number in the drawings, and descriptions thereof are omitted in some cases.

The method of processing a silicon substrate of the present invention is suitable for forming a through hole, e.g., a liquid supply path of a liquid ejection head in a silicon substrate in a manufacturing step of a device, e.g., a structure including a silicon substrate, particularly a liquid ejection head, or the like. An example in which the method of processing a silicon substrate of the present invention is applied to manufacturing of a substrate having energy generating elements provided in a liquid ejection head, that is, a substrate for a liquid ejection head is described below. Needless to say, the method of processing a silicon substrate of the present invention is not limited to manufacturing of a substrate for a liquid ejection head, and can also be used for manufacturing and processing of another structure using a silicon substrate. When the method of processing a silicon substrate of the present invention is applied to manufacturing of a substrate for a liquid ejection head, it is preferred that a substrate having a surface whose crystal orientation is a (100) plane or a surface whose crystal orientation is equivalent to a (100) plane be used as a silicon substrate. In this case, it is preferred that the silicon substrate having a thickness of from about 580 μm to about 750 μm be used.

FIG. 1 is an illustration of an example of a liquid ejection head manufactured by applying the method of processing a silicon substrate of the present invention. A liquid ejection head 1 includes a silicon substrate 10 on which energy generating elements 2 configured to generate energy for ejecting a liquid are arranged in two rows at a predetermined pitch. The energy generating elements 2 are provided only on one surface of the silicon substrate 10 forming a substrate for a liquid ejection head. In the following description, of two surfaces of the silicon substrate 10, a surface on which the energy generating elements 2 are provided is referred to as a first surface, and a surface on an opposite side of the first surface, which is opposed to the first surface, is referred to as a second surface. Further, the silicon substrate 10 has an elongated rectangular shape extending in the alignment direction of the energy generating elements 2, and a longitudinal direction of the silicon substrate 10 is defined as an X direction and a direction (short direction of the silicon substrate 10) orthogonal to the X direction is defined as a Y direction.

In the silicon substrate 10, a supply path 13 that penetrates the silicon substrate 10 so as to supply a liquid from the second surface side to the first surface side is opened between the two rows of the energy generating elements 2. As described later, the supply path 13 is provided in the silicon substrate 10 by anisotropic etching from the second surface side, and has a slit-like shape extending in the arrangement direction of the energy generating elements 2, that is, the X direction. Herein, the supply path 13 has a tapered sectional shape that becomes narrower from the second surface side to the first surface side. Further, in the supply path 13, a beam 51 is formed so as to connect opposed sides extending in the longitudinal direction of the supply path 13 (X direction). As described later, the beam 51 is formed simultaneously when the supply path 13 is formed in the silicon substrate 10 by anisotropic etching. The beam 51 serves to enhance mechanical strength of the silicon substrate 10 in which the supply path 13 is formed. The dimension of the beam 51 (beam height) in a thickness direction of the silicon substrate 10 is smaller than the thickness of the silicon substrate 10. In other words, the beam 51 is provided only partially in the thickness direction of the silicon substrate 10. Thus, the supply path 13 is not divided into a plurality of portions by providing the beam 51. The number of the beams 51 provided in one supply path 13 is not limited to one, and a plurality of beams 51 can be provided in one supply path 13.

An ejection orifice forming member 9 is provided on the first surface of the silicon substrate 10. In the ejection orifice forming member 9, ejection orifices 11 are formed so as to correspond to the respective energy generating elements 2. The ejection orifice forming member 9 is a member that also serves as a ceiling and a side wall of a flow path 25 communicating from the supply path 13 to each of the ejection orifices 11. The ejection orifice forming member 9 is a member that forms a part of the flow path 25 and is brought into contact with a liquid, and hence the ejection orifice forming member 9 is required to have high mechanical strength as a structural material, adhesion to the silicon substrate 10 on the underlying side, and liquid resistance (such as ink resistance). Further, the ejection orifice forming member 9 is required to have resolution for patterning a fine pattern as the ejection orifices 11.

As a material for satisfying the characteristics required in the ejection orifice forming member 9, there is given, for example, a cationically polymerizable epoxy resin composition. Examples of the epoxy resin preferably used include a reactant of bisphenol A and epichlorohydrin, and a reactant of bromine-containing bisphenol A and epichlorohydrin. Further, an example thereof is a reactant of phenol novolac or o-cresol novolac and epichlorohydrin. In this case, the epoxy resin preferably has an epoxy equivalent of 2,000 or less, more preferably an epoxy equivalent of 1,000 or less. When the epoxy equivalent is more than 2,000, the cross-linking density is decreased during a curing reaction of the epoxy resin, and the adhesion and ink resistance when the ejection orifice forming member 9 is formed may be decreased. As a photocationic polymerization initiator for curing the epoxy resin, there is given a compound for generating an acid by light irradiation. For example, an aromatic sulfonium salt or an aromatic iodonium salt is preferably used. Further, as needed, a wavelength sensitizer may be added. As the wavelength sensitizer, there is given, for example, SP-100 (trade name) commercially available from Adeka Corporation.

The liquid ejection head 1 illustrated in FIG. 1 is disposed so that the surface on which the ejection orifices 11 are formed is opposed to a recording surface of a recording medium. Then, energy generated by the energy generating elements 2 is applied to a liquid (such as ink) filled into the flow path 25 through the supply path 13, to thereby eject liquid droplets from the ejection orifices 11. The liquid droplets are caused to adhere to the recording medium, to thereby perform recording.

Next, the step of simultaneously forming the supply path 13 and the beam 51 on the silicon substrate 10 that is the substrate for a liquid ejection head is described. A region corresponding to a position at which the supply path 13 is to be formed on the second surface of the silicon substrate 10 is referred to as a supply path forming region. In the method of processing a silicon substrate of the present invention, a plurality of non-through holes having a predetermined depth, which do not penetrate the silicon substrate 10, are formed in the supply path forming region from the second surface side, and then, the silicon substrate 10 is subjected to anisotropic etching from the second surface side. In the following, the step of forming the plurality of non-through holes in the supply path forming region is referred to as a non-through hole forming step, and the step of subjecting the silicon substrate 10 having the non-through holes formed therein to anisotropic etching, to thereby simultaneously form the supply path 13 and the beam 51 in the supply path 13 is referred to as an etching step. In order to prevent the anisotropic etching from proceeding at a position besides the supply path forming region, it is necessary that an etching mask be provided in advance on the second surface of the silicon substrate 10. The etching mask is provided at least at a position except the supply path forming region. The etching mask is, for example, an oxide film to be provided on the second surface. As illustrated in an embodiment described later, the etching mask can also be provided in a part of the supply path forming region. Further, an etching stop layer is provided in advance on the first surface of the silicon substrate 10. In order to obtain the beam 51 having a desired shape, a sacrificial layer may be provided in advance between the first surface and the etching stop layer so as to correspond to a region corresponding to the position at which the supply path 13 is to be formed on the first surface.

In the etching step, as disclosed in Japanese Patent Application Laid-Open No. 2007-269016, the anisotropic etching proceeds from the second surface of the silicon substrate 10, and the anisotropic etching also proceeds from a side surface and a bottom surface of each of the non-through holes. In this case, the proceeding rate of etching in the anisotropic etching is also changed by changing the interval or the depth of each of the plurality of non-through holes. In general, when the interval between the non-through holes is reduced, and the depth of the non-through holes is increased, the time required for the adjacent non-through holes to be connected by the anisotropic etching is shortened, and an etching speed is increased. In view of the foregoing, the supply path forming region on the second surface of the silicon substrate 10 is partitioned into a first region that corresponds to the forming position of the beam 51, a second region that is adjacent to the first region on both sides of the first region, and a third region that is none of the first region and the second region. Then, non-through holes are not provided in the first region, and a plurality of non-through holes are provided in the second and third regions. Further, at least one of the interval or the depth of each of the plurality of non-through holes is caused to differ in the second region and the third region. In this case, for example, when the interval of the non-through holes in the second region is set to be smaller than that in the third region, or the depth of the non-through holes in the second region is set to be larger than that in the third region, the anisotropic etching in the second region, that is, in the vicinity of the beam 51 is allowed to proceed faster as compared to the other regions. Thus, when the time of the anisotropic etching in the etching step is changed by changing the interval and the depth of the non-through holes in the non-through hole forming step, the depth of the beam 51 from the first surface of the silicon substrate 10 can be controlled. Further, the depth and the width of the beam 51 can also be controlled by the distance between the second regions that are adjacent to each other with the first region interposed therebetween, the depth therein, and the time of the anisotropic etching. Thus, in the processing method of the present invention, the dimension of the beam 51 to be formed in the supply path 13 is controlled through the anisotropic etching step and the non-through hole forming step. Further, in this method, the etching time of the anisotropic etching can be shortened by performing the non-through hole formation, and hence the processing time required for forming the supply path 13 and the beam 51 is also expected to be shortened as compared to the case where the non-through holes are not provided. In the case where the substrate for a liquid ejection head is manufactured by the processing method of the present invention, it is preferred that a silicon substrate having energy generating elements and a wiring layer extending to the energy generating elements provided on a first surface be used as the silicon substrate 10.

Specific embodiments of the method of processing a silicon substrate of the present invention are described by way of exemplifying the case where a substrate for a liquid ejection head is manufactured.

Embodiment 1

Figure 2A:
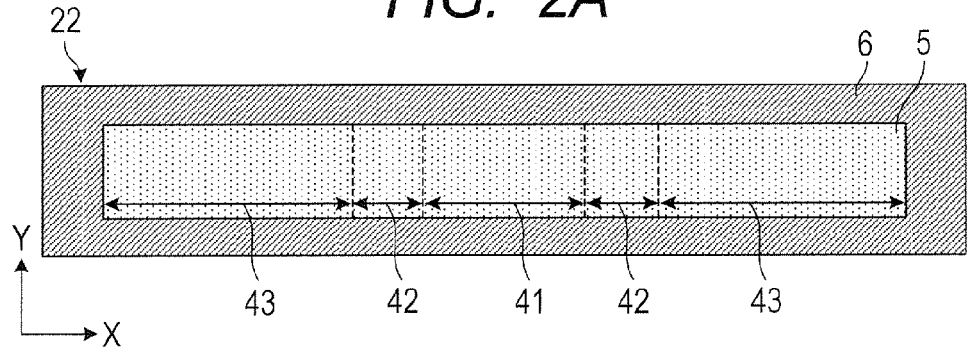
FIGS. 2A, 2B and 2C are each a plan view of a second surface of a silicon substrate in Embodiment 1 of the present invention.
Figure 2B:
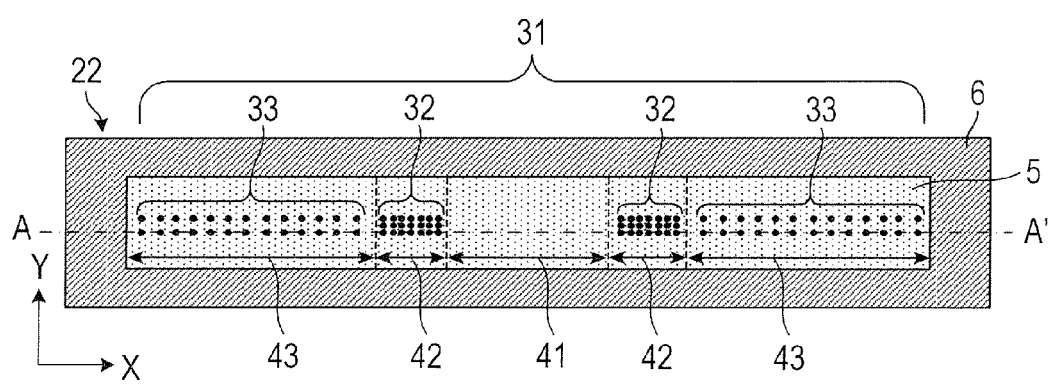
Figure 2C:
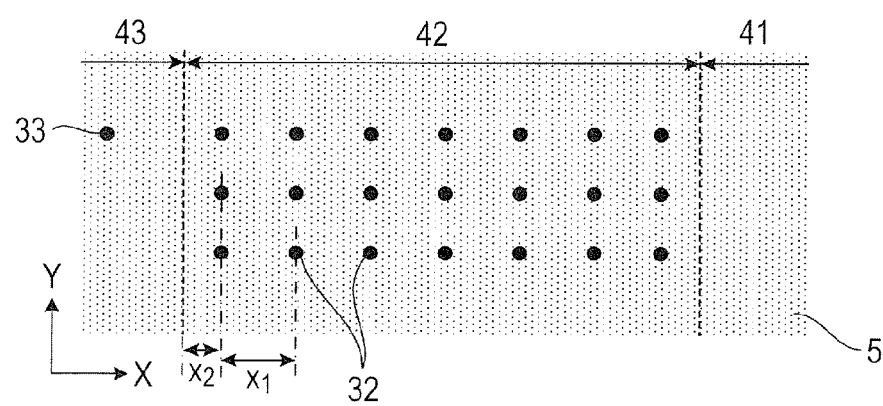
Figure 3A:
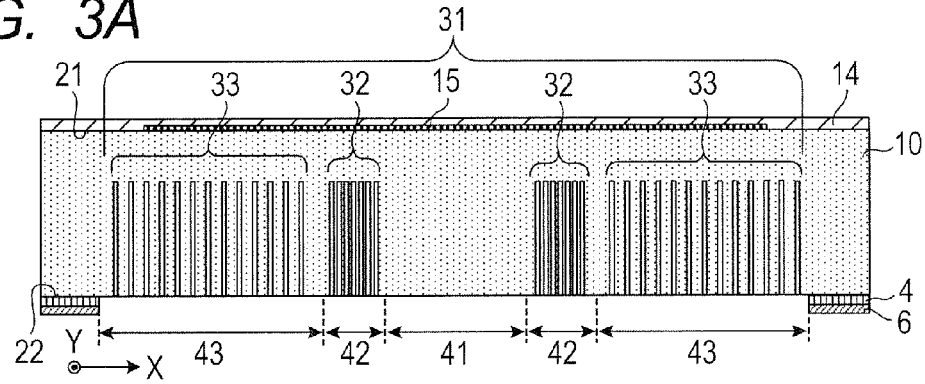
FIGS. 3A, 3B, 3C and 3D are each a sectional view for illustrating a forming process of a supply path and a beam in Embodiment 1.

First, as the silicon substrate 10, an elongated rectangular substrate having a substrate surface whose crystal orientation is a (100) plane is prepared. Energy generating elements (not shown) are formed in advance on one surface of the silicon substrate 10, and this surface is defined as a first surface 21 and the other surface is defined as a second surface 22. FIG. 2A is a plan view of the second surface 22 of the silicon substrate 10, and FIG. 2B and FIG. 2C are each an illustration of the arrangement of non-through holes on the second surface 22. FIG. 3A to FIG. 3D are each a sectional view for illustrating a forming process of the supply path 13 and the beam 51 step-by-step. In particular, FIG. 3A is a sectional view for illustrating a state after the non-through hole forming step is completed and before the etching step is started. As illustrated in FIG. 2A, FIG. 2B, and FIG. 3A, an oxide film 4 is formed in a part of the second surface 22. As the oxide film 4, there is given, for example, $SiO_2$. A region in which the oxide film 4 is not formed corresponds to an opening 5 in the oxide film 4 and has a slit-like shape extending in the X direction. In this embodiment, the region of the opening 5 is matched with a region in which the supply path 13 is to be formed by anisotropic etching described later. In the second surface 22, a protective film 6 may be formed on the oxide film 4 although not necessary. The protective film 6 is not formed at a position of the opening 5. As the protective film 6, for example, a polyether amide resin can be used. In this embodiment, the configuration in which the protective film 6 is formed is considered. The oxide film 4 and the protective film 6 also serve as an etching mask in the anisotropic etching.

A sacrificial layer 15 may be formed in a part of the first surface 21 of the silicon substrate 10. The position at which the sacrificial layer 15 is to be formed corresponds to, for example, a region in the first surface 21 corresponding to the position at which the supply path 13 is to be formed. In this embodiment, the configuration in which the sacrificial layer 15 is formed is considered. The sacrificial layer 15 has a feature of being etched more easily by the anisotropic etching as compared to the silicon substrate 10. Through formation of the sacrificial layer 15, an opening width of the supply path 13 in the second surface 22 can be controlled satisfactorily. The sacrificial layer 15 can be formed of, for example, an Al—Si alloy, an Al—Cu alloy, or Cu. The sacrificial layer 15 is not required in terms of the configuration, and thus may not be provided. Further, when a portion corresponding to the sacrificial layer 15 is set to be a void portion, the void portion can replace the sacrificial layer 15. In this case, an etchant proceeds in the void portion faster than the case where the sacrificial layer 15 is formed, and hence the same effects as those of the sacrificial layer 15 are obtained. The sacrificial layer 15 is covered with a passivation layer 14 having etching resistance. As the passivation layer 14, there is given, for example, $SiO_2$ described above or SiN. The passivation layer 14 also serves as an etching stop layer and is directly provided on the first surface 21 at a position where the sacrificial layer 15 is not provided.

In this embodiment, in the opening 5 of the second surface 22 of the silicon substrate 10, that is, the supply path forming region, a plurality of non-through holes 31 that do not penetrate the silicon substrate 10 are formed with a predetermined depth from the second surface 22, that is, the opening 5 side. As a non-through hole forming method, there is given, for example, a processing method using irradiation of laser light. As the laser light, for example, a three-time wave (THG: wavelength 355 nm) of a YAG (yttrium, aluminum, garnet) laser can be used. Note that, the wavelength of the laser is not limited thereto, and it is sufficient that the wavelength enable processing of silicon (Si), which is a material for forming the silicon substrate 10. The depth of the non-through holes 31 can be set to any depth. However, as the non-through holes 31 are deeper, in other words, the tip ends of the non-through holes 31 are closer to the first surface 21 of the silicon substrate 10, the time required for the non-through holes 31 to arrive at the sacrificial layer 15 by the anisotropic etching is shortened. That is, the processing time of the anisotropic etching is shortened. Therefore, it is preferred that the depth of the non-through holes 31 be set to a depth of from about 40% to about 95% of the thickness of the silicon substrate 10.

Next, the anisotropic etching is performed from the second surface 22 of the silicon substrate 10. As an etchant to be used in the anisotropic etching, there are given, for example, strong alkaline solutions such as tetramethylammonium hydroxide (TMAH) and potassium hydroxide (KOH). When the etching is started, in the non-through holes 31, a (111) plane is formed toward the first surface 21, and the etching proceeds also in a direction perpendicular to the thickness direction of the silicon substrate 10. Meanwhile, a (111) plane is formed so as to spread toward the first surface 21 from the opening 5 of the second surface 22. Further, when the etching proceeds, two non-through holes 31 are connected to each other, and a (100) plane is formed therebetween. The (100) plane proceeds toward the first surface 21 by the etching to arrive at the sacrificial layer 15 formed on the first surface 21, to thereby form the supply path 13.

In this embodiment, the supply path 13 is formed by the etching mechanism described above, and in order to form the beam 51 simultaneously with the supply path 13, the arrangement of the non-through holes 31 in the supply path forming region of the second surface 22 is determined. FIG. 2A to FIG. 2C are each an illustration of the arrangement of the non-through holes 31 in the second surface 22. The dimension of the supply path forming region, that is, the opening 5 is determined by the arrangement of the ejection orifices 11 in the liquid ejection head 1 to be manufactured and the intended dimension of a supply path. Therefore, there is no particular limitation on the dimension of the opening 5, but the dimension of the opening 5 in the X direction of FIG. 2A to FIG. 2C, that is, in a direction along an ejection orifice row is preferably from about 5 mm to about 40 mm, and the dimension thereof in the Y direction of FIG. 2A to FIG. 2C is preferably from about 200 µm to about 1.5 mm.

FIG. 2A is a plan view of the opening 5 viewed from the second surface 22 side of the silicon substrate 10 before the processing of forming the non-through holes 31 is performed. As illustrated in FIG. 2A, three regions 41 to 43 are defined in the longitudinal direction (X direction) of the opening 5, that is, the supply path forming region. The first region 41 is defined as a beam forming region corresponding to the forming position of the beam 51. The second region 42 is defined as a region in the vicinity of the first region 41. Each region that is adjacent to the first region 41 on both sides of the first region 41 corresponds to the second region 42. The third region 43 is defined as a region obtained by excluding the first region 41 and the second region 42 from the supply path forming region. Through the definition described above, the number of the first regions 41 to be set in the single opening 5 becomes the number of the beams 51 to be formed in the supply path 13. Further, of the non-through holes 31, the non-through holes to be processed in the second region 42 are defined as non-through holes 32, and the non-through holes to be processed in the third region 43 are defined as non-through holes 33. The non-through holes 31 may also be processed in the first region 41, but it is preferred that the non-through holes 31 not be formed in the first region 41 from the viewpoint of the balance with the second region 42. In this embodiment, the case where the number of the beams 51 to be formed in the supply path 13 is one, that is, the number of the first regions 41 to be set in the single opening 5 is one is considered. Each of the first region 41 and the second region 42 can be set in at least one portion at any position within the opening 5 as long as the first region 41 and the second region 42 are set within the opening 5, which is illustrated in the other embodiments described later.

It is preferred that the non-through holes 31 be arranged substantially symmetrically with respect to a center line of the opening 5 along the longitudinal direction (X direction) from the viewpoint of the forming accuracy and the uniformity of the supply path 13 and the beam 51. It is preferred that the arrangement interval of the non-through holes 31 be set within the region of the opening 5 in consideration of the diameter of the non-through holes 31, the processing position accuracy of a processing device by the irradiation of laser light, the alignment accuracy, and the like so that the adjacent non-through holes 31 do not overlap each other. It is preferred that the diameter of the non-through holes 31 to be processed onto the silicon substrate 10 be from about 5 µm to about 100 µm. In this embodiment, the arrangement interval of the non-through holes 31 is defined as a shortest distance between centers of the adjacent non-through holes 31 for each of the regions 41 to 43 in each of the X direction and the Y direction. Further, the arrangement interval of the non-through holes 31 may also be different in the X direction and the Y direction.

Next, the above-mentioned regions are described in detail. First, the first region 41 corresponds to a region in which the beam 51 is to be formed within the supply path 13. The width and height of the beam 51 to be formed can be adjusted by the region. Any longitudinal dimension can be set in the first region 41, but the longitudinal dimension of from about 600 µm to about 3 mm is preferred.

The second region 42 is a region for assisting in formation of the beam 51 at a position from the first surface 21 to the second surface 22 by etching performed from the sacrificial layer 15 side at time of formation of the beam 51 in the first region 41. Therefore, it is preferred that the arrangement interval of the non-through holes 32 in the second region 42 be smaller than that of the non-through holes 31 in the other regions. When the arrangement interval is set as described above, and the anisotropic etching is performed, the non-through holes that are adjacent to each other are connected to each other faster in the second region 42 in which the arrangement interval of the non-through holes 32 is small as compared to the other regions. With this, in the second region 42, the tip end of an etching surface arrives at the sacrificial layer 15 faster, and hence the etching of the first region 41 from the first surface 21 side (sacrificial layer 15 side) can be accelerated. For example, in the case where the diameter of the non-through holes 32 is about 10 µm, the processing position accuracy of a laser processing device is about ±10 µm, and the alignment accuracy is about ±5 µm, it is preferred that the arrangement interval of the non-through holes 32 in the second region 42 be set to from about 40 µm to about 90 µm. The second region 42 is formed on both sides of the first region 41 in the longitudinal direction (X direction) of the opening 5. Therefore, in the case where one first region 41 is present in the single opening 5, two second regions 42 are provided. The dimension of the second region 42 in the longitudinal direction (X direction) of the opening 5 can be set to any dimension, but is preferably from about 80 µm to about 720 µm.

The third region 43 corresponds to a region in which only the supply path 13 is to be formed. For example, in the case where the diameter of the non-through holes 33 is about 10 µm, the processing position accuracy of the laser processing device is about ±10 µm, and the alignment accuracy is about ±5 µm, it is preferred that the arrangement interval of the non-through holes 33 in the third region 43 be set to from about 100 µm to about 550 µm. In the single opening 5, the remaining obtained by excluding the first region 41 and the second region 42 from the whole opening 5 becomes the whole third region 43. For example, in the case where one first region 41 is present in the single opening 5, two third regions 43 are provided. Therefore, regarding the dimension of the opening 5 in the longitudinal direction (X direction), the dimension of the third region 43 is determined by the dimension of the opening 5, the numbers of the first regions 41 and the second regions 42, and the longitudinal dimension of each of the first region 41 and the second region 42.

FIG. 2B is an illustration of the second surface 22 of the silicon substrate 10 after the non-through holes are processed in each of the regions 41 to 43 as described above. Further, in the case where the non-through holes 31 are processed in each of the regions 41 to 43, it is preferred that the non-through holes 31 be processed so as to satisfy <1> and <2> described below. FIG. 2C is an illustration of the arrangement of the non-through holes 32 in the second region 42, which satisfies <1> and <2>.

<1> In the longitudinal direction (X direction), the non-through holes are processed substantially symmetrically with respect to a center line along the Y direction of each region.

<2> In the longitudinal direction, in the case where the interval of the non-through holes adjacent to each other in each region is defined as $x_1$, and the distance between the end portion of each region and the center position of the non-through hole closest to the end portion is defined as $x_2$, the non-through holes are processed so as to satisfy the following expression (1). Note that, $x_1$ may take different values for each region.

$$x_1/2 \leq x_2 \leq x_1 \quad (1)$$

Further, regarding the alignment of the non-through holes 31 along the X direction in each region, an appropriate number of rows of the non-through holes 31 can be arranged in consideration of the dimension of the opening 5 in the Y direction, the interval of the non-through holes 31, and the like.

Next, an example is described regarding the relationship between the difference between the arrangement interval of the non-through holes 32 in the second region 42 and the arrangement interval of the non-through holes 33 in the third region 43, and the arrival of the anisotropic etching at the sacrificial layer 15 in each region. The arrangement intervals in the X direction and the Y direction of the non-through holes 32 in the second region are defined to be equal to each other, and the arrangement intervals are defined as $r_a$ (μm). Similarly, the arrangement intervals in the X direction and the Y direction of the non-through holes 33 in the third region are defined to be equal to each other, and the arrangement intervals are defined as $r_b$ (μm). In this embodiment, as described above, $r_b > r_a$ is set, and the difference $\Delta r_1$ (μm) therebetween is represented by the following expression (2).

$$\Delta r_1 = r_b - r_a \quad (2)$$

Further, in the X direction and the Y direction, considering that the anisotropic etching of an Si(110) plane or a plane equivalent to the Si(110) plane in terms of crystal orientation proceeds at an equal speed, the etching speed is defined as v (μm/min). The difference in distance at which the adjacent non-through holes are connected to each other between the second region 42 and the third region 43 is $\Delta r_1/2$. Therefore, considering a time difference $\Delta t_1$ (min), $\Delta t_1$ can be represented by the following expression (3).

$$\Delta t_1 = (\Delta r_1/2)/v \quad (3)$$

As $\Delta t_1$ is larger, the non-through holes are connected to each other faster in the second region 42 as compared to the third region 43 when the anisotropic etching is performed. Along with this, the etching surface arrives at the sacrificial layer 15 faster in the second region 42, and hence the etching is performed from the sacrificial layer 15 side by the time represented by $\Delta t_1$ at time of formation of the beam 51 in the first region 41 as described above. With this, the formation of the beam 51 at a position retracted toward the second surface 22 from the surface position of the first surface 21 can be accelerated. Even in the case where the sacrificial layer is not provided, the etching surface arrives at the interface between the first surface 21 and the passivation layer 14 faster in the second region 42 as compared to the third region 43, and after that, the etching surface is enlarged in a direction parallel to the first surface 21. Therefore, the formation of the beam 51 can be accelerated.

Figure 3B:
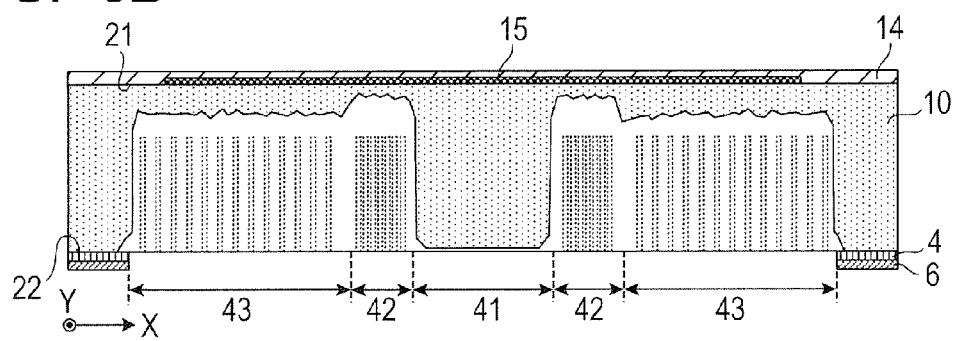
Figure 3C:
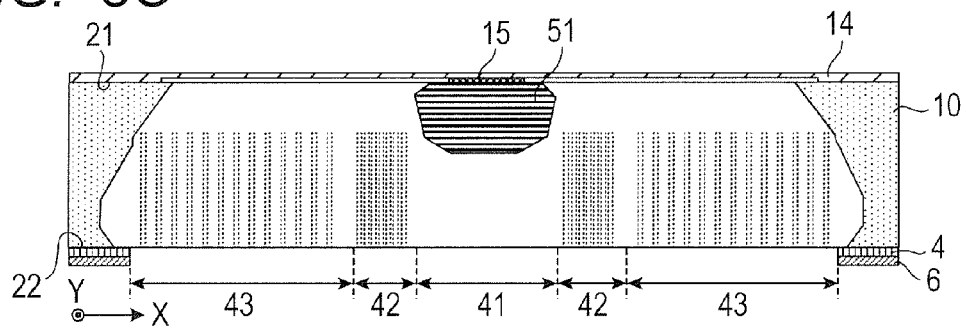

Next, a forming process of the beam 51 in Embodiment 1 is described in more detail. FIG. 3A to FIG. 3D are each a sectional view for schematically illustrating a forming process of the supply path 13 and the beam 51 step-by-step through the non-through hole forming step and the etching step in this embodiment, and FIG. 4A to FIG. 4C are each an illustration of the supply path 13 and the beam 51 thus formed. The arrangement, the dimension, and the interval of the non-through holes 31 of each of the regions 41 to 43 in the opening 5 are the same as those described above, and each sectional view of FIG. 3A to FIG. 3D and FIG. 4A corresponds to a cross-section taken along the line A-A' of FIG. 2B. The depth of each of the non-through holes 31 can be set appropriately in consideration of the thickness of the silicon substrate 10, the intended shape of the flow path 13, the shape of the beam 51, the anisotropic etching time, the interval of the non-through holes 31, and the like. The anisotropic etching conditions can be similarly set appropriately in consideration of the intended shape of the supply path 13, the shape of the beam 51, the etching time, the interval of the non-through holes, and the like.

As described above, FIG. 3A is an illustration of the state after the non-through hole forming step is completed and before the etching step is started. When the anisotropic etching of the silicon substrate 10 is started from the second surface 22, silicon is gradually etched and removed from the silicon substrate 10 through the non-through holes 31 and the opening 5 of the second surface 22. FIG. 3B is an illustration of a stage in the middle of the etching. In this state, in the second region 42 and the third region 43, the etching surface of the anisotropic etching has not arrived at the sacrificial layer 15. Contours of the non-through holes 31 before the start of the etching are represented by the dotted line in FIG. 3B. In this case, the arrangement interval of the non-through holes 32 in the second region 42 is smaller than that of the non-through holes 33 in the third region 43, and hence the anisotropic etching in the thickness direction of the silicon substrate 10 proceeds faster in the second region as compared to the third region 43. FIG. 3C is an illustration of a state in which the anisotropic etching is performed further for about 2 hours after the state illustrated in FIG. 3B. In the state illustrated in FIG. 3C, the etching surface has arrived at the sacrificial layer 15 in any of the second region 42 and the third region 43. In the first region 41, the anisotropic etching proceeds from the second surface 22 side of the silicon substrate 10 to the first surface 21 side thereof. Further, the anisotropic etching proceeds from the second region 42 also in directions (X direction and Y direction) perpendicular to the thickness direction of the silicon substrate 10, and a plurality of different crystal planes are formed in the thickness direction of the silicon substrate 10. This is because of the influence of both the etching from the first surface 21 side and the etching from the second surface 22 side in addition to the side etching from the second region 42. With this, the beam 51 is formed in the first region 41. Note that, in this state, the sacrificial layer 15 of the beam portion has not been etched completely, and the beam 51 is connected to a part of the sacrificial layer 15.

Figure 3D:
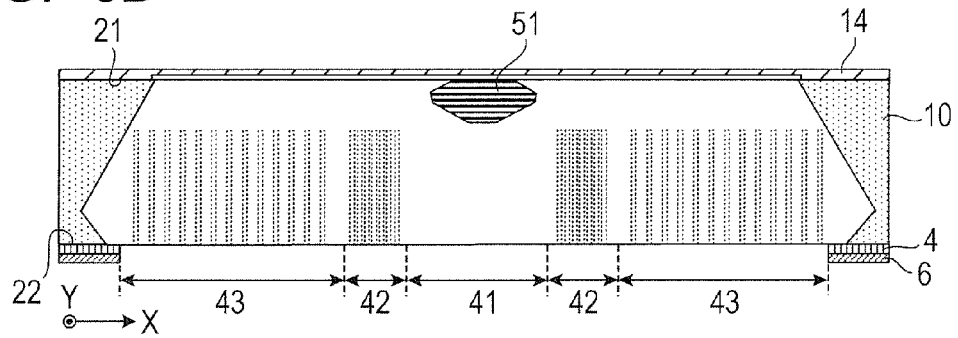
Figure 4A:
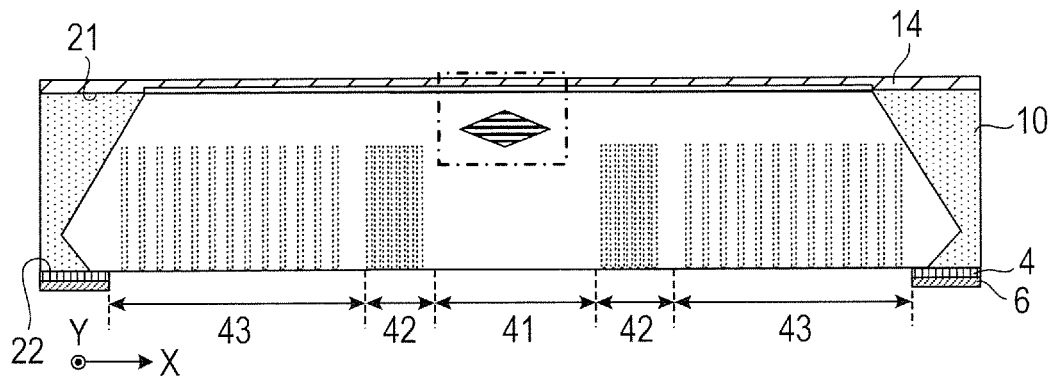
FIG. 4A is a sectional view for illustrating a supply path and a beam formed in Embodiment 1.
Figure 4B:
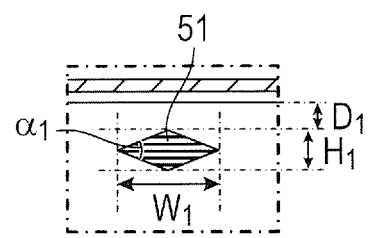
FIG. 4B is an enlarged view of a region indicated by the dot-and-dash line of FIG. 4A.
Figure 4C:
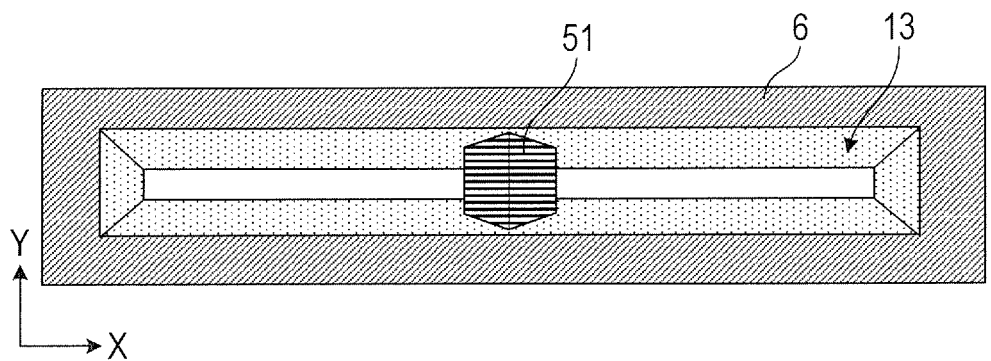
FIG. 4C is a plan view of the second surface of the silicon substrate corresponding to FIG. 4A.

FIG. 3D is an illustration of a state in which the anisotropic etching is performed further for about 2 hours after the state illustrated in FIG. 3C. In the state illustrated in FIG. 3D, the etching from the first surface side (sacrificial layer 15 side) and the etching from the second surface 22 side further proceed in addition to the side etching from the second region 42. As a result, the sacrificial layer 15 is eliminated completely, and the beam 51 becomes smaller. FIG. 4A is an illustration of a state after the anisotropic etching is performed further for about 2 hours, and the supply path 13 and the beam 51 thus formed are illustrated. In this case, a sectional shape of the beam 51 is a rhombic shape having a major axis in the X direction, and the beam 51 extends in the Y direction in the supply path 13 so as to connect opposed sides (sides extending in the X direction in this case) of the supply path 13. FIG. 4B is an illustration of a portion surrounded by the dot-and-dash line in FIG. 4A in an enlarged manner. The reason that the cross-section of the beam 51 becomes a rhombic shape is that the etching further proceeds from the state illustrated in FIG. 3D, and the etching speed on a surface in which the etching speed is high is limited. As illustrated in FIG. 4B, a dihedral $\alpha_1$ of the beam 51 in the rhombic cross-section was about 50°. From this, it can be confirmed that the beam 51 is formed of a surface different from a Si(111) plane under beam forming conditions of Embodiment 1. The shape of the beam 51 to be formed finally is determined by the plane orientation and the material of the silicon substrate 10, the anisotropic etching conditions, and the like. That is, the shape of the beam 51 can be adjusted by changing the elements described above. Further, the position of an apex closest to the first surface 21 in the sectional shape of the beam 51 is retracted toward the second surface 22 from the surface position of the first surface 21. After this, when the passivation layer 14 is removed in accordance with the forming position of the supply path 13, the supply path 13 that penetrates through the silicon substrate 10 and is configured to supply a liquid from the second surface 22 side to the first surface 21 side is completed, with the result that the substrate for a liquid ejection head is completed.

In Embodiment 1, the dimension in the cross-section in the X direction of the beam 51 formed in the supply path 13 is defined as illustrated in FIG. 4B. The shortest distance between the surface position of the first surface 21 and the beam 51 in the thickness direction of the silicon substrate 10 is defined as a beam depth $D_1$. The outermost dimension of the beam 51 in the thickness direction of the silicon substrate 10 is defined as a beam height $H_1$. The outermost dimension of the beam 51 in a direction (X direction) perpendicular to the thickness direction of the silicon substrate 10 is defined as a beam width $W_1$. It is preferred that the beam depth $D_1$ be set to 50 μm or more in the application of the substrate for a liquid ejection head from the viewpoint of the ejection function such as refill characteristics at time of ejection of a liquid from the ejection orifices 11. It is preferred that the beam height $H_1$ and the beam width $W_1$ be set to 100 μm or more from the viewpoint of the enhancement of reliability such as mechanical strength of the liquid ejection head 1. It is necessary to determine the dimension of the beam 51 in further consideration of the characteristics, such as the influence of the dissolution of silicon into a liquid that is to be actually ejected from a liquid ejection head, the expected age of service of the liquid ejection head, and the like. FIG. 4C is a plan view of the silicon substrate 10 illustrated in FIG. 4A viewed from the second surface 22 side.

Embodiment 2

Figure 5A:
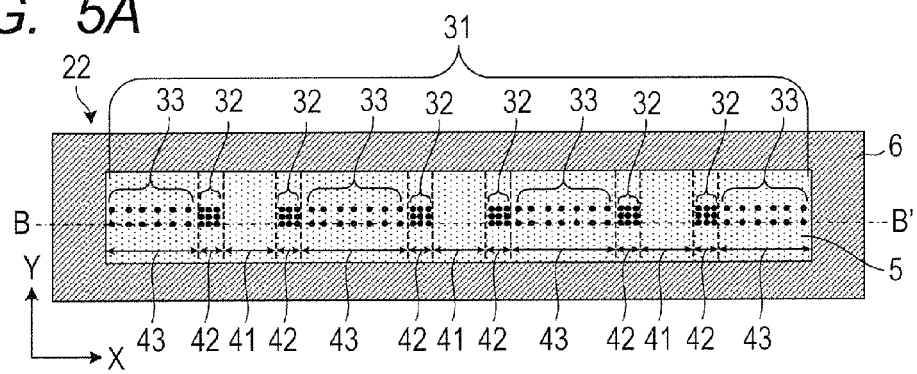
FIGS. 5A and 5D are each a plan view of a second surface of a silicon substrate for illustrating a forming process of a supply path and a beam in Embodiment 2 of the present invention.
Figure 5B:
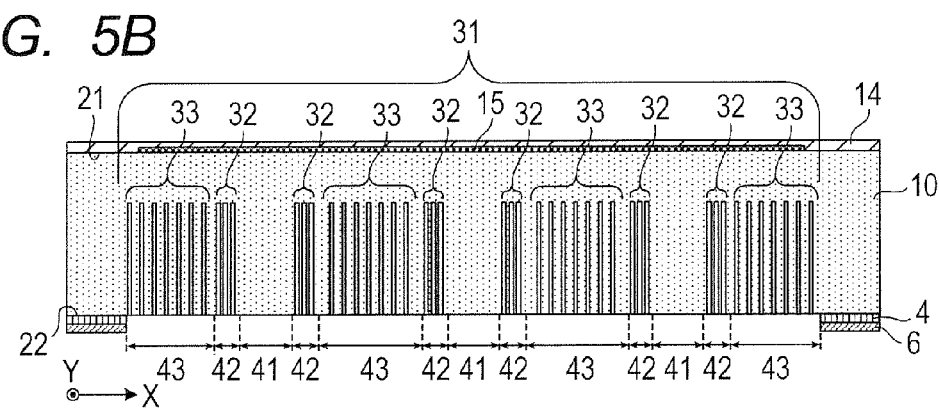
FIGS. 5B and 5C are each a sectional view thereof.
Figure 5C:
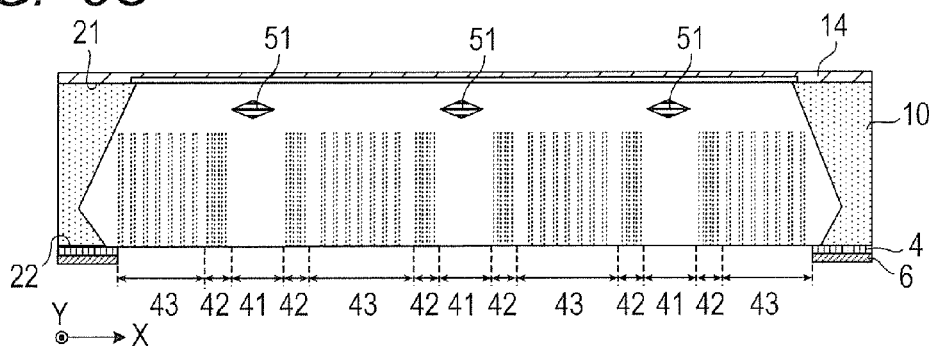
Figure 5D:
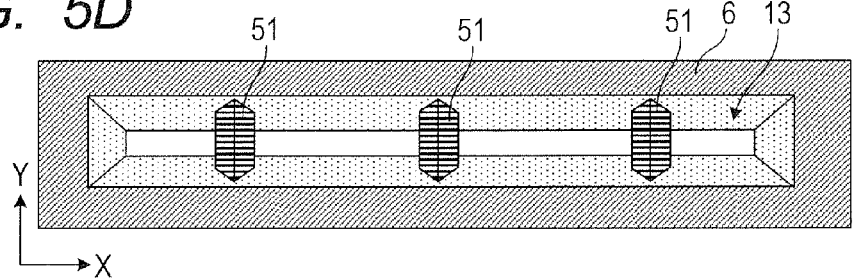

In Embodiment 1 described above, one first region 41 serving as the beam forming region is set in the single opening 5, and the second regions 42 are respectively set on both sides of the first region 41. In this case, in the case where the first region 41 and the second regions 42 on both sides of the first region 41 are considered as one group, a plurality of such groups may also be set in the single opening 5. That is, a plurality of beams 51 may also be provided in the supply path 13. Embodiment 2 is similar to Embodiment 1, but Embodiment 2 is different from Embodiment 1 in that three beams 51 are provided in the supply path 13. FIG. 5A to FIG. 5D are each a view for illustrating the forming process of the supply path 13 and the beam 51 in Embodiment 2. FIG. 5A and FIG. 5B are each a view for illustrating a state after the non-through hole forming step is completed and before the etching step is started in the same manner as in FIG. 2B and FIG. 3A of Embodiment 1, and for illustrating a formed state of the non-through holes 31 in each of the regions 41 to 43. FIG. 5B is a sectional view taken along the line B-B' of FIG. 5A. FIG. 5C is a sectional view for illustrating a state after the anisotropic etching is completed, and FIG. 5D is a plan view of the silicon substrate 10 illustrated in FIG. 5C viewed from the second surface 22 side.

Embodiment 2 is the same as Embodiment 1 with the exception that three first regions 41 are provided in the opening 5, and that the second regions are respectively disposed on both sides of each of the first regions 41. Thus, the forming idea and forming method of the supply path 13 and the beams 51 in Embodiment 2 are the same as those of Embodiment 1, and two or four or more beams 51 may also be formed.

Embodiment 3

Figure 6A:
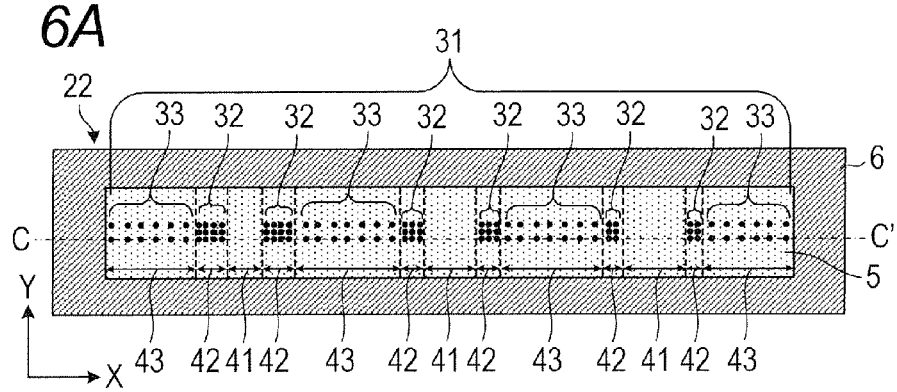
FIGS. 6A and 6D are each a plan view of a second surface of a silicon substrate for illustrating a forming process of a supply path and a beam according to Embodiment 3 of the present invention.
Figure 6B:
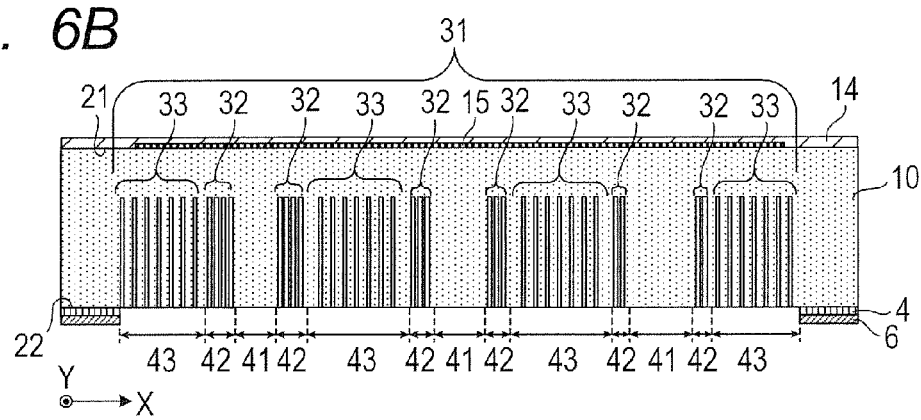
FIGS. 6B and 6C are each a sectional view thereof.
Figure 6C:
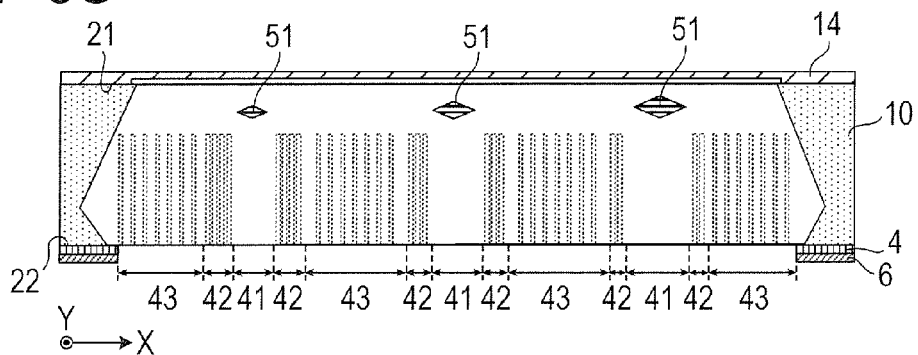
Figure 6D:
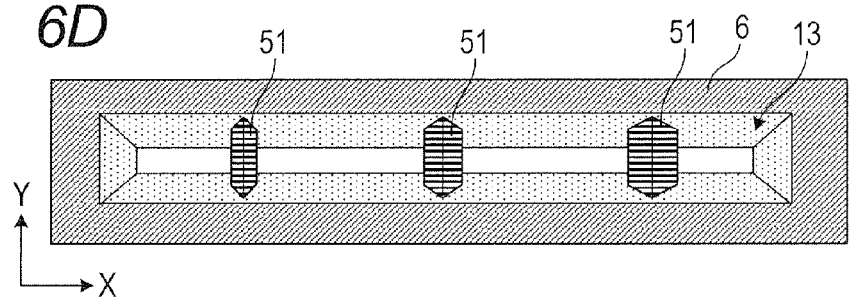

In the case where the first region 41 and the second regions 42 on both sides of the first region 41 are considered as one group, and a plurality of such groups are set in the single opening 5, different dimensions in the longitudinal direction (X direction) of the opening 5 can be set with respect to each group of the first region 41 and the second regions 42. That is, a plurality of beams 51 having different dimensions and shapes can be formed in the supply path 13. In Embodiment 3, three beams 51 are provided in the supply path 13 in the same manner as in Embodiment 2, but Embodiment 3 is different from Embodiment 2 in that the dimensions and the shapes of the respective beams 51 are different from each other. FIG. 6A to FIG. 6D are each a view for illustrating a forming process of the supply path 13 and the beams 51 in Embodiment 3. FIG. 6A and FIG. 6B are each a view for illustrating a state after the non-through hole forming step is completed and before the etching step is started and for illustrating a formed state of the non-through holes 31 in each of the regions 41 to 43. FIG. 6B is a sectional view taken along the line C-C' of FIG. 6A. FIG. 6C is a sectional view for illustrating a state after the anisotropic etching is completed, and FIG. 6D is a plan view of the silicon substrate 10 illustrated in FIG. 6C viewed from the second surface 22 side. As is understood from the figures described above, in the case where the beams 51 that are relatively large are formed, it is sufficient that the dimension in the X direction of the first region 41 corresponding to the beam 51 be set to be large, while the dimension in the X direction of the second region 42 adjacent to the first region 41 corresponding to the beam 51 be set to be small. The forming idea and forming method of the supply path 13 and the beams 51 in Embodiment 3 are the same as those of Embodiments 1 and 2, and two or four or more beams 51 may also be formed. In this embodiment, at least two beams 51 are provided in the supply path 13, and at least one of the beams 51 can be made different in at least one of a dimension or a shape from another beam 51 in the supply path 13.

Embodiment 4

In Embodiment 1, the beam 51 is formed at the position which is retracted from the first surface 21 of the silicon substrate 10 to the second surface 22 thereof in the supply path 13 but is closer to the first surface 21 as compared to the second surface 22. The forming position of the beam 51 in the thickness direction of the silicon substrate 10 is not limited thereto, and the beam 51 can also be provided so as to be substantially brought into contact with the surface position of the second surface 22. In Embodiment 4, the beam 51 is provided on the side closer to the second surface 22 in the supply path 13.

Figure 7A:
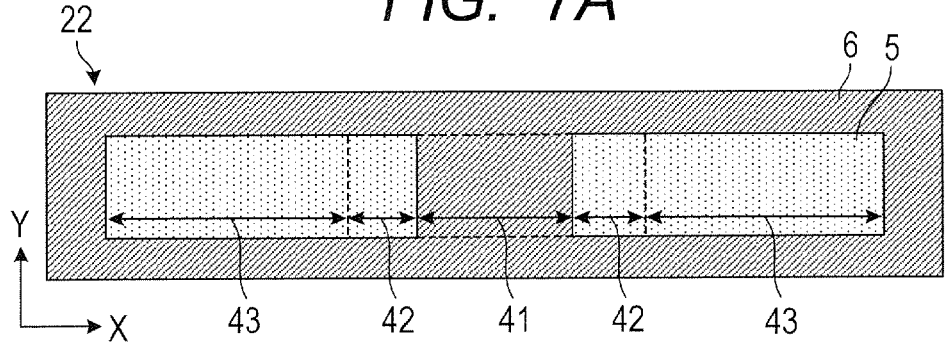
FIGS. 7A, 7B and 7C are each a plan view of a second surface of a silicon substrate for illustrating arrangement of non-through holes in Embodiment 4 of the present invention.
Figure 7B:
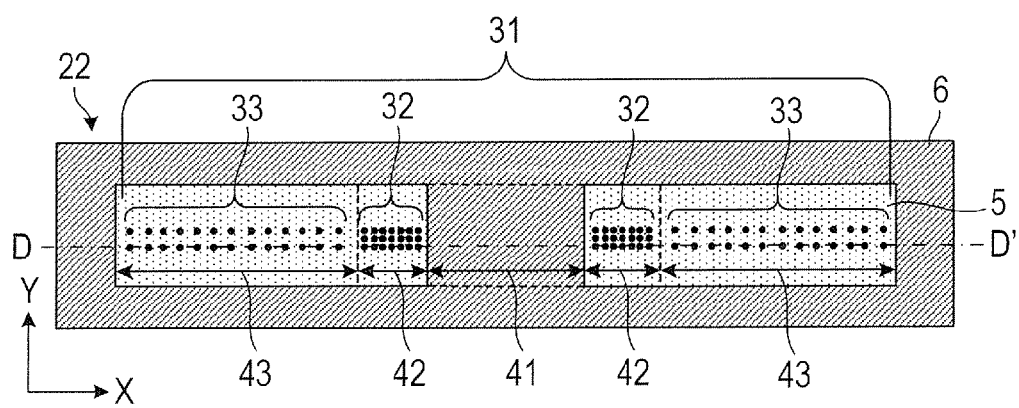
Figure 7C:
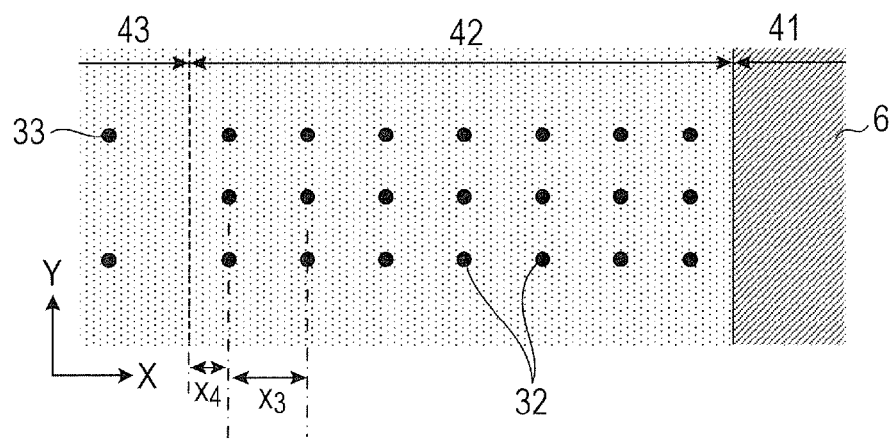

Energy generating elements are formed in advance on the first surface 21 in the same manner as in Embodiment 1. The elongated rectangular silicon substrate 10 having a surface whose crystal orientation is a (100) plane is prepared. FIG. 7A to FIG. 7C are each a plan view of the second surface 22 in the same manner as in FIG. 2A to FIG. 2C, and FIG. 8A to FIG. 8D are each a sectional view for illustrating a forming process of the supply path 13 and the beam 51 step-by-step in the same manner as in FIG. 3A to FIG. 3D. In this embodiment, the supply path forming region in which the supply path 13 is to be formed by anisotropic etching described later also has a slit-like shape extending in the X direction in the same manner as in Embodiment 1, and as illustrated in FIG. 7A, the supply path forming region is partitioned into the first region 41, the second region 42, and the third region 43. The regions 41 to 43 are defined in the longitudinal direction (X direction) of the supply path forming region. The first region 41 is defined as a beam forming region corresponding to the forming position of the beam 51. The second region is defined as a region in the vicinity of the first region 41. Each region that is adjacent to the first region 41 on both sides of the first region 41 corresponds to the second region 42. The third region 43 is defined as a region obtained by excluding the first region 41 and the second region 42 from the supply path forming region. Through the definition described above, the number of the first regions 41 to be set in the supply path forming region becomes the number of the beams 51 to be formed in the supply path 13.

In this embodiment, the oxide film 4 made of, for example, $SiO_2$ is also provided in a part of the second surface 22. However, unlike Embodiment 1, the oxide film 4 is provided in a region besides the supply path forming region in the second surface 22, and is also provided in the first region 41 serving as the beam forming region in the supply path forming region. Thus, the opening 5 in the oxide film 4 corresponds to the second region 42 and the third region 43 of the supply path forming region. Further, the protective film 6 may be formed on the oxide film 4 although not necessary. As the protective film 6, for example, a polyether amide resin can be used. In this embodiment, the configuration in which the protective film 6 is formed is considered.

The sacrificial layer 15 may be formed in a part of the first surface 21 of the silicon substrate 10 in the same manner as in Embodiment 1. The position at which the sacrificial layer 15 is to be formed corresponds to, for example, a region in the first surface 21 corresponding to the position at which the supply path 13 is to be formed. In this embodiment, the configuration in which the sacrificial layer 15 is formed is considered. Through provision of the sacrificial layer 15, as described in Embodiment 1, the formation of the beam 51 can be accelerated, and the opening width of the supply path 13 can be controlled more satisfactorily. As the sacrificial layer 15, the same layer as that used in Embodiment 1 can be used, and a void portion may be provided in place of the sacrificial layer 15. The sacrificial layer 15 is covered with the passivation layer 14 (etching stop layer) having etching resistance. As the passivation layer 14, there is given, for example, $SiO_2$ or SiN. The passivation layer 14 is directly provided on the first surface 21 at a position where the sacrificial layer 15 is not provided.

In this embodiment, in the opening 5 of the second surface 22 of the silicon substrate 10, that is, in the second region 42 and the third region 43 of the supply path forming region, a plurality of non-through holes 31 that do not penetrate through the silicon substrate 10 are formed from the opening 5 side. As a non-through hole forming method, the processing method using irradiation of laser light described in Embodiment 1 can be used. The depth of the non-through holes 31 can be set to any depth. However, as the non-through holes 31 are deeper, the time required for the non-through holes 31 to arrive at the sacrificial layer 15 by the anisotropic etching is shortened. That is, the processing time of the anisotropic etching is shortened. Therefore, it is preferred that the depth of the non-through holes 31 be set to a depth of from about 40% to about 95% of the thickness of the silicon substrate 10. In this embodiment, of the non-through holes 31, the non-through holes to be processed in the second region 42 are defined as the non-through holes 32, and the non-through holes to be processed in the third region 43 are defined as the non-through holes 33. In Embodiment 4, the case where the number of the beams 51 to be formed in the supply path 13 is one, that is, the case where the number of the first regions 41 to be set in the single supply path forming region is one is considered. Each of the first region 41 and the second region 42 can be set in at least one portion at any position within the supply path forming region, as long as the supply path 13 falls within a range of conditions to be satisfied, which is illustrated in the other embodiments described later.

It is preferred that the non-through holes 31 be arranged substantially symmetrically with respect to a center line of the opening 5 along the longitudinal direction (X direction) from the viewpoint of the forming accuracy and the uniformity of the supply path 13 and the beam 51. It is preferred that the arrangement interval of the non-through holes 31 be set within the region of the opening 5 in consideration of the diameter of the non-through holes 31, the processing position accuracy of a processing device by the irradiation of laser light, the alignment accuracy, and the like so that the adjacent non-through holes 31 do not overlap each other. It is preferred that the diameter of the non-through holes 31 to be processed onto the silicon substrate 10 be from about 5 μm to about 100 μm. In this embodiment, the arrangement interval of the non-through holes 31 is defined as a shortest distance between centers of the adjacent non-through holes 31 for each of the regions 42 and 43 in each of the X direction and the Y direction. Further, the arrangement interval of the non-through holes 31 may also be different in the X direction and the Y direction.

Next, the anisotropic etching is performed from the second surface 22 of the silicon substrate 10. As an etchant to be used in the anisotropic etching, there are given, for example, strong alkaline solutions such as TMAH and KOH in the same manner as in Embodiment 1. Then, as described in Embodiment 1, when the etching proceeds, and the etching surface arrives at the sacrificial layer 15, the supply path 13 is formed. In this embodiment, in order for the beam 51 to be formed simultaneously with the supply path 13, the shape of the first region 41 is determined, and the arrangement of the non-through holes 31 in the second region 42 and the third region 43 of the second surface 22 are determined. The dimension of the whole supply path forming region is determined by the arrangement of the ejection orifices 11 in the liquid ejection head 1 to be formed and the intended dimension of the supply path 13. Therefore, the dimension of the opening 5 is not particularly limited, but the dimension of the opening 5 in the X direction illustrated in the figures, that is, a direction along an ejection orifice row is preferably from about 5 mm to about 40 mm, and the dimension of the opening in the Y direction illustrated in the figures is preferably from about 200 μm to about 1.5 mm.

Next, the first region 41, the second region 42, and the third region 43 to be set in the second surface 22 of the silicon substrate 10 are described. The first region 41 corresponds to a region in which the beam 51 is to be formed in the supply path 13, and the oxide film 4 and the protective film 6 are formed in the first region 41. The width and height of the beam 51 to be formed can be adjusted by the dimension of the first region 41. The dimension of the first region 41 in the X direction can be set arbitrarily, but is preferably from about 600 μm to about 3 mm.

The second region 42 is a region for assisting in formation of the beam 51 on the second surface 22 side by etching performed from the sacrificial layer 15 side at time of formation of the beam 51 in the first region 41. Therefore, it is preferred that the arrangement interval of the non-through holes 32 in the second region 42 be smaller than that of the non-through holes 31 in the third region 43. When the anisotropic etching is performed by setting the arrangement interval as described above, the non-through holes that are adjacent to each other are connected to each other faster in the second region 42 in which the arrangement interval of the non-through holes 32 is small as compared to the other regions. With this, in the second region 42, the tip end of an etching surface arrives at the sacrificial layer 15 faster, and hence the etching of the first region 41 from the first surface 21 side (sacrificial layer 15 side) can be accelerated. For example, in the case where the diameter of the non-through holes 32 is about 10 μm, the processing position accuracy of a laser processing device is about ±10 μm, and the alignment accuracy is about ±5 μm, it is preferred that the arrangement interval of the non-through holes 32 in the second region 42 be set to from about 40 μm to about 90 μm. The second region 42 is formed on both sides of the first region 41 in the longitudinal direction (X direction) of the supply path forming region. Therefore, in the case where one first region 41 is present in the single supply path forming region, two second regions 42 are provided. The dimension of the second region 42 in the longitudinal direction (X direction) of the opening 5 can be set to any dimension, but is preferably from about 80 μm to about 720 μm.

The third region 43 corresponds to a region in which only the supply path 13 is to be formed. For example, in the case where the diameter of the non-through holes 33 is about 10 μm, the processing position accuracy of the laser processing device is about ±10 μm, and the alignment accuracy is about ±5 μm, it is preferred that the arrangement interval of the non-through holes 33 in the third region 43 be set to from about 100 μm to about 550 μm. In the opening 5, the remaining obtained by excluding the second region 42 from the whole opening 5 becomes the third region 43. In the case where one first region 41 is present in the single supply path forming region, two third regions 43 are provided. Regarding the dimension of the opening 5 in the longitudinal direction (X direction), the dimension of the third region 43 is determined by the dimension of the opening 5 and the longitudinal dimension of the second region 42.

FIG. 7B is an illustration of the second surface 22 of the silicon substrate 10 after the non-through holes are processed in the regions 41 and 42 as described above. Further, in the case where the non-through holes 31 are processed in the regions 41 and 42, it is preferred that the non-through holes 31 be processed so as to satisfy <3> and <4> described below. FIG. 7C is an illustration of the arrangement of the non-through holes 32 in the second region 42, which satisfies <3> and <4>.

<3> In the longitudinal direction (X direction), the non-through holes are processed substantially symmetrically with respect to a center line along the Y direction of each region.

<4> In the longitudinal direction, in the case where the interval of the non-through holes adjacent to each other in each region is defined as $x_3$, and the distance between the end portion of each region and the center position of the non-through hole closest to the end portion is defined as $x_4$, the non-through holes are processed so as to satisfy the following expression (4). Note that, $x_3$ may take different values for each region.

$$x_3/2 \leq x_4 \leq x_3 \qquad (4)$$

Further, regarding the alignment of the non-through holes 31 along the X direction in each region, an appropriate number of rows of the non-through holes 31 can be arranged in consideration of the dimension of the opening 5 in the Y direction, the interval of the non-through holes 31, and the like.

Next, an example is described regarding the relationship between the difference between the arrangement interval of the non-through holes 32 in the second region 42 and the arrangement interval of the non-through holes 33 in the third region 43, and the arrival of the anisotropic etching at the sacrificial layer 15 in each region. The arrangement intervals in the X direction and the Y direction of the non-through holes 32 in the second region are defined to be equal to each other, and the arrangement intervals are defined as $r_c$ (μm). Similarly, the arrangement intervals in the X direction and the Y direction of the non-through holes 33 in the third region are defined to be equal to each other, and the arrangement intervals are defined as $r_d$ (μm). In this embodiment, as described above, $r_d > r_c$ is set, and the difference $\Delta r_2$ (μm) therebetween is represented by the following expression (5).

$$\Delta r_2 = r_d - r_c \qquad (5)$$

Further, in the X direction and the Y direction, considering that the anisotropic etching of an Si(110) plane or a plane equivalent to the Si(110) plane in terms of crystal orientation proceeds at an equal speed, the etching speed is defined as v (μm/min). The difference in distance at which the adjacent non-through holes are connected to each other between the second region 42 and the third region 43 is $\Delta r_2/2$. Therefore, considering a time difference $\Delta t_1$ (min), $\Delta t_1$ can be represented by the following expression (6).

$$\Delta t_2 = (\Delta r_2/2)/v \qquad (6)$$

As $\Delta t_2$ is larger, the non-through holes are connected to each other faster in the second region 42 as compared to the third region 43 when the anisotropic etching is performed. Along with this, the etching surface arrives at the sacrificial layer 15 faster in the second region 42, and hence the etching is performed from the sacrificial layer 15 side by the time represented by $\Delta t_2$ at time of formation of the beam 51 in the first region 41 as described above. With this, the formation of the beam 51 on the second surface 22 side of the silicon substrate 10 can be accelerated. Even in the case where the sacrificial layer 15 is not formed, the etching surface arrives at the interface between the first surface 21 and the passivation layer 14 faster in the second region 42 as compared to the third region 43, and after that, the etching surface is enlarged in a direction parallel to the first surface 21. Therefore, the formation of the beam 51 can be accelerated.

Next, a forming process of the beam 51 in Embodiment 4 is described in more detail. FIG. 8A to FIG. 8D are each a sectional view for schematically illustrating a forming process of the supply path 13 and the beam 51 step-by-step through the non-through hole forming step and the etching step in Embodiment 4, and FIG. 9A to FIG. 9C are each an illustration of the supply path 13 and the beam 51 thus formed. The arrangement, the dimension, and the interval of the non-through holes 31 of each of the regions 41 to 43 in the opening 5 are the same as those described above, and each sectional view of FIG. 8A to FIG. 8D and FIG. 9A corresponds to a cross-section taken along the line D-D' of FIG. 7B. As described above, the sacrificial layer 15 is formed in a partial region of the first surface 21 of the silicon substrate 10, and the first surface 21 as well as the sacrificial layer 15 is covered with the passivation layer 14. The anisotropic etching conditions can be set appropriately in consideration of the intended shape of the supply path 13, the shape of the beam 51, the etching time, the interval of the non-through holes, and the like.

Figure 8A:
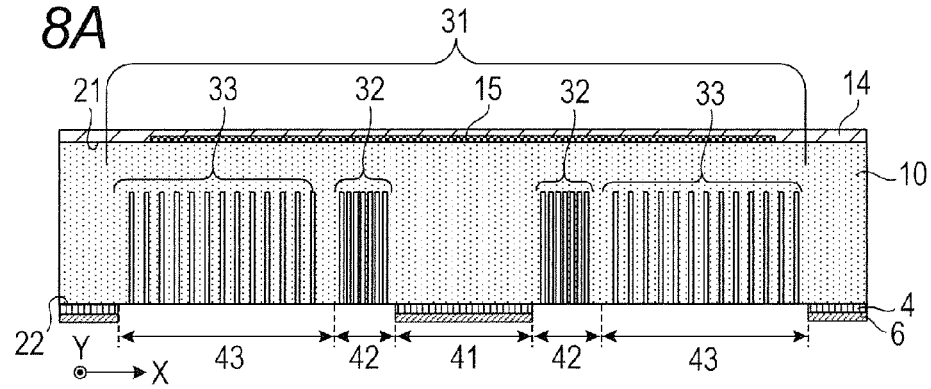
FIGS. 8A, 8B, 8C and 8D are each a sectional view for illustrating a forming process of a supply path and a beam in Embodiment 4.
Figure 8B:
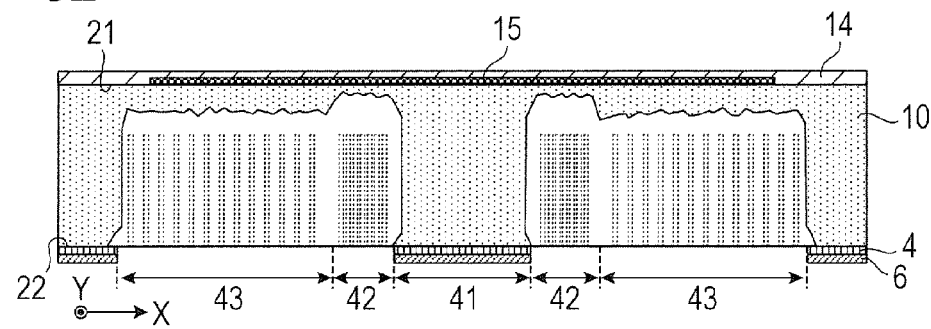
Figure 8C:
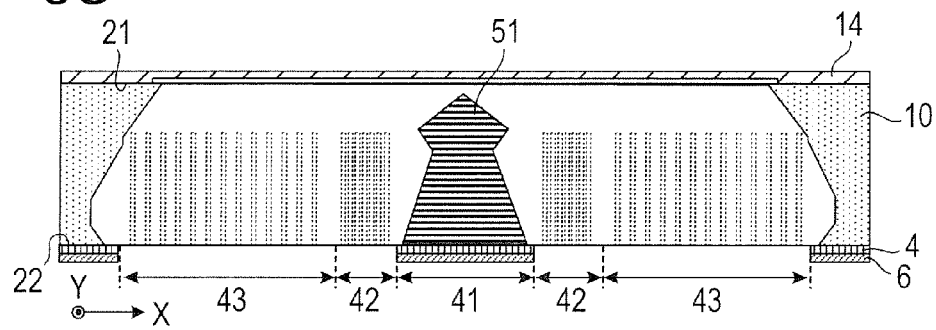
Figure 9A:
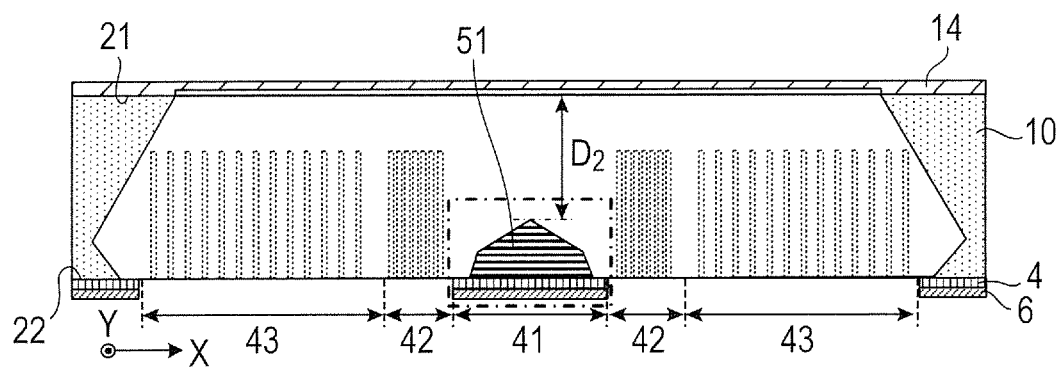
FIG. 9A is a sectional view for illustrating the supply path and the beam formed in Embodiment 4.
Figure 9B:
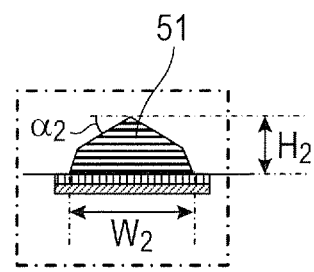
FIG. 9B is an enlarged view of a region surrounded by the dot-and-dash line of FIG. 9A.
Figure 9C:
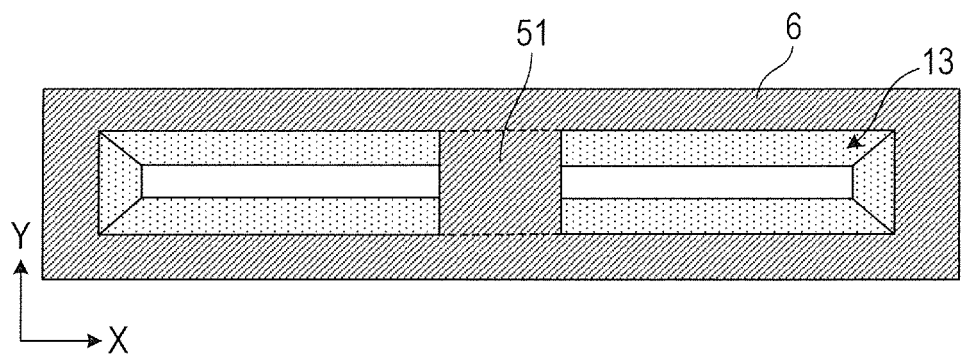
FIG. 9C is a plan view of the second surface of the silicon substrate corresponding to FIG. 9A.

FIG. 8A is an illustration of the state after the non-through hole forming step is completed and before the etching step is started. When the anisotropic etching of the silicon substrate 10 is started from the second surface 22, silicon is gradually etched and removed from the silicon substrate 10 through the non-through holes 31 and the opening 5 of the second surface 22. FIG. 8B is an illustration of a stage in the middle of the etching. In this state, in the second region 42 and the third region 43, the etching surface of the anisotropic etching has not arrived at the sacrificial layer 15. Contours of the non-through holes 31 before the start of the etching are represented by the dotted line in FIG. 8B. In this case, the arrangement interval of the non-through holes 32 in the second region 42 is smaller than that of the non-through holes 33 in the third region 43, and hence the anisotropic etching in the thickness direction of the silicon substrate 10 proceeds faster in the second region 42 as compared to the third region 43. FIG. 8C is an illustration of a state in which the anisotropic etching is performed further for about 5 hours after the state illustrated in FIG. 8B. In this state, the etching surface has arrived at the sacrificial layer 15 in any of the second region 42 and the third region 43, and the etching from the first surface 21 side (sacrificial layer 15 side) proceeds. Further, the anisotropic etching proceeds from the second region 42 also in a direction perpendicular to the thickness direction of the silicon substrate 10, and a plurality of different crystal planes are formed in the thickness direction of the silicon substrate 10. This is because of the influence of both the etching from the first surface 21 side and the etching from the second surface 22 side in addition to the side etching from the second region 42. With this, the beam 51 is formed in the first region 41 in contact with the oxide film 4.

Figure 8D:
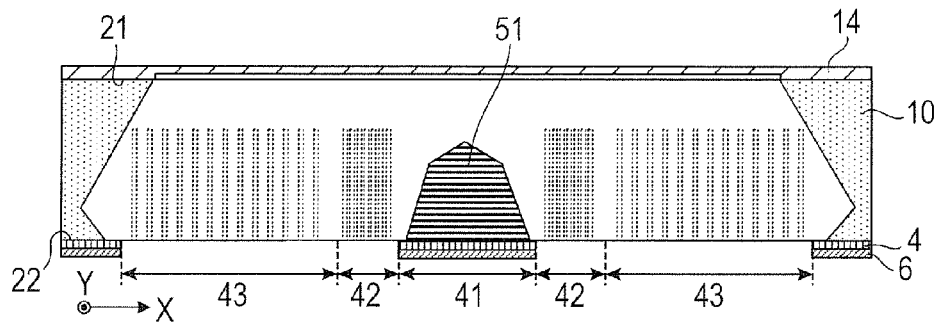

FIG. 8D is an illustration of a state in which the anisotropic etching is performed further for about 2 hours after the state illustrated in FIG. 8C. In the state illustrated in FIG. 8D, the etching from the first surface side (sacrificial layer 15 side) and the etching from the second surface 22 side further proceed in addition to the side etching from the second region 42. As a result, the beam 51 becomes smaller while being held in contact with the oxide film 4. FIG. 9A is an illustration of a state after the anisotropic etching is performed further for about 1 hour, and the supply path 13 and the beam 51 thus formed are illustrated. A sectional shape of the beam is a pentagon, and the beam 51 extends in the Y direction in the supply path 13 so as to connect opposed sides (sides extending in the X direction in this case) of the supply path 13. FIG. 9B is an illustration of a portion surrounded by the dot-and-dash line in FIG. 9A in an enlarged manner. The reason that the cross-section of the beam 51 becomes a pentagon is that the etching proceeds from the state illustrated in FIG. 3D while the beam 51 is held in contact with the oxide film 4 serving as the etching mask, and the etching speed on a surface in which the etching speed is high is limited. As illustrated in FIG. 9B, an angle $\alpha_2$ formed by a surface of the beam 51 closest to the first surface 21 and a plane parallel to the first surface 21 was about 25°. From this, it can be confirmed that the beam 51 is formed of a surface different from a Si(111) plane under beam forming conditions of Embodiment 4. The final shape of the beam 51 to be formed is determined by the dimension in the X direction of the first region 41 in which the oxide film 4 and the protective film 6 are formed, the plane orientation and the material of the silicon substrate 10, the anisotropic etching conditions, and the like. That is, the shape of the beam 51 can be adjusted by changing the elements described above, and the sectional shape of the beam 51 can also be set to a triangle. Further, the position of an apex closest to the first surface 21 in the sectional shape of the beam 51 is retracted toward the second surface 22 from the surface position of the first surface 21. After this, when the passivation layer 14 is removed in accordance with the forming position of the supply path 13, the supply path 13 that penetrates through the silicon substrate 10 and is configured to supply a liquid from the second surface 22 side to the first surface 21 side is completed, with the result that the substrate for a liquid ejection head is completed.

In Embodiment 4, the dimension in the cross-section in the X direction of the beam 51 formed in the supply path 13 is defined as illustrated in FIG. 9A and FIG. 9B. The shortest distance between the surface position of the first surface 21 and the beam 51 in the thickness direction of the silicon substrate 10 is defined as a beam depth $D_2$. The longest distance of the beam 51 in the thickness direction of the silicon substrate 10 is defined as a beam height $H_2$. The longest distance of the beam 51 in a direction (X direction) perpendicular to the thickness direction of the silicon substrate 10 is defined as a beam width $W_2$. It is preferred that the beam depth $D_2$ be set to 50 µm or more in the application of the substrate for a liquid ejection head from the viewpoint of the ejection function such as refill characteristics at time of ejection of a liquid from the ejection orifices 11. It is preferred that the beam height $H_2$ and the beam width $W_2$ be set to 100 µm or more from the viewpoint of the enhancement of reliability such as mechanical strength of the liquid ejection head 1. It is necessary to determine the dimension of the beam 51 in further consideration of the characteristics, such as the influence of the dissolution of silicon into a liquid that is to be actually ejected from a liquid ejection head, the expected age of service of the liquid ejection head, and the like. FIG. 9C is a plan view of the silicon substrate 10 illustrated in FIG. 9A viewed from the second surface 22 side.

Embodiment 5

Figure 10A:
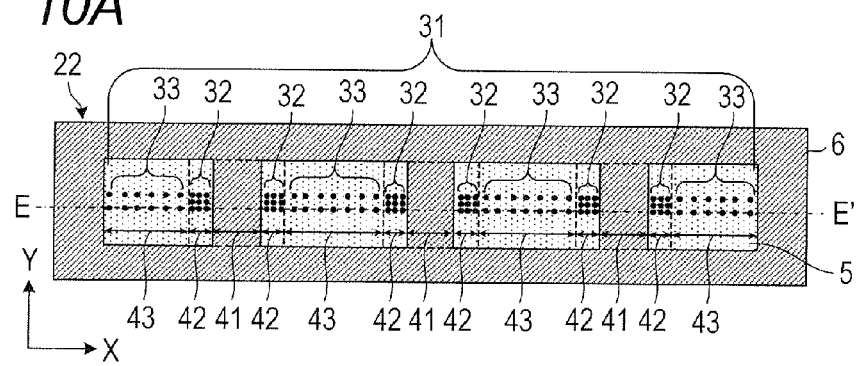
FIGS. 10A and 10D are each a plan view of a second surface of a silicon substrate for illustrating a forming process of a supply path and a beam in Embodiment 5 of the present invention.
Figure 10B:
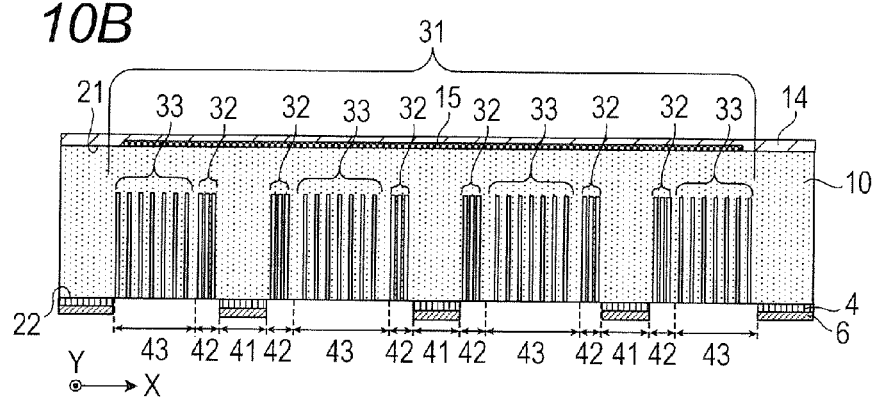
FIGS. 10B and 10C are each a sectional view thereof.
Figure 10C:
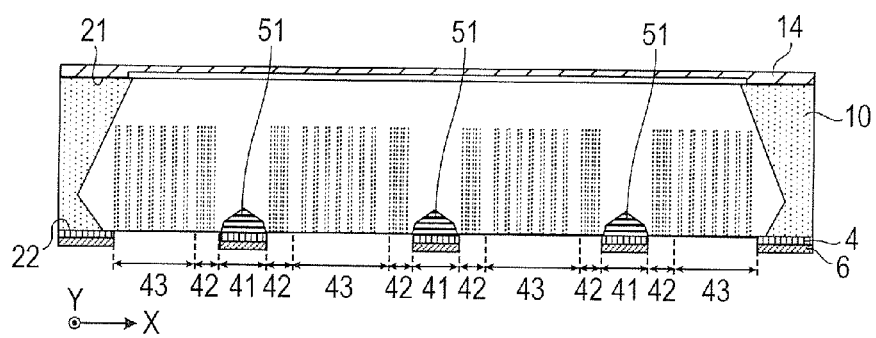
Figure 10D:
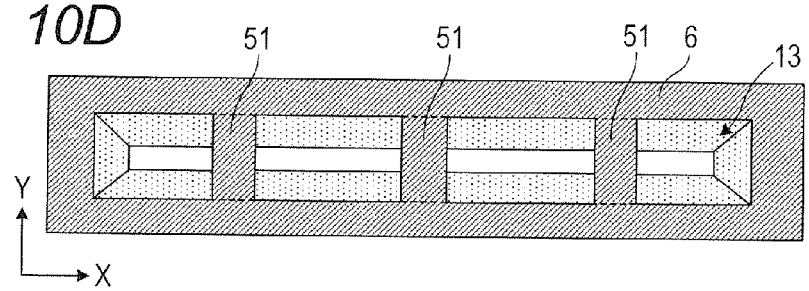

In Embodiment 4 described above, one first region 41 serving as the beam forming region is set in the single supply path forming region, and the second regions 42 are respectively set on both sides of the first region 41. In this case, in the case where the first region 41 and the second regions 42 on both sides of the first region 41 are considered as one group, a plurality of such groups may also be set in the single supply path forming region. That is, a plurality of beams 51 may also be provided in the supply path 13. Embodiment 5 is similar to Embodiment 4, but Embodiment 5 is different from Embodiment 4 in that three beams 51 are provided in the supply path 13. FIG. 10A to FIG. 10D are each a view for illustrating the forming process of the supply path 13 and the beams 51 in Embodiment 5. FIG. 10A and FIG. 10B are each a view for illustrating a state after the non-through hole forming step is completed and before the etching step is started in the same manner as in FIG. 7B and FIG. 8A of Embodiment 4, and for illustrating the arrangement of the non-through holes 32 in the second region 42 and the arrangement of the non-through holes 33 in the third region 43. FIG. 10B is a sectional view taken along the line E-E' of FIG. 10A. FIG. 10C is a sectional view for illustrating a state after the anisotropic etching is completed, and FIG. 10D is a plan view of the silicon substrate 10 illustrated in FIG. 10C viewed from the second surface 22 side. Embodiment 5 is the same as Embodiment 4 with the exception that three first regions 41 are provided in the supply path forming region, and that the second regions are disposed respectively on both sides of each of the first regions 41. Thus, the forming idea and forming method of the supply path 13 and the beams 51 in Embodiment 5 are the same as those in Embodiment 4, and two or four or more beams 51 can also be formed.

Embodiment 6

Figure 11A:
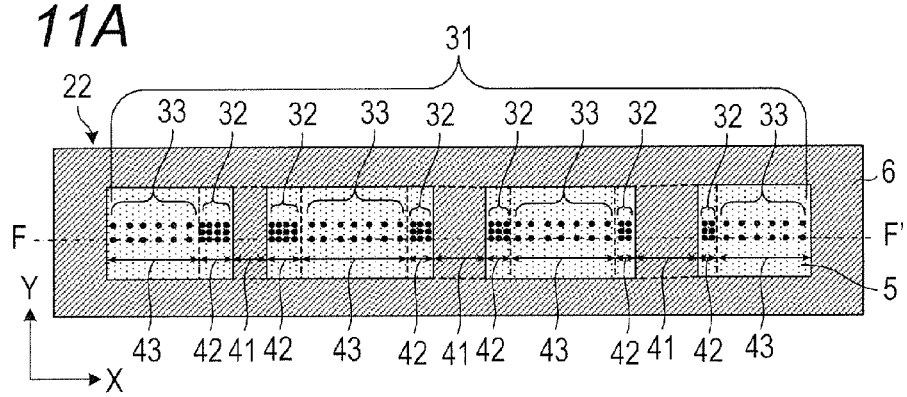
FIGS. 11A and 11D are each a plan view of a second surface of a silicon substrate for illustrating a forming process of a supply path and a beam in Embodiment 6 of the present invention.
Figure 11B:
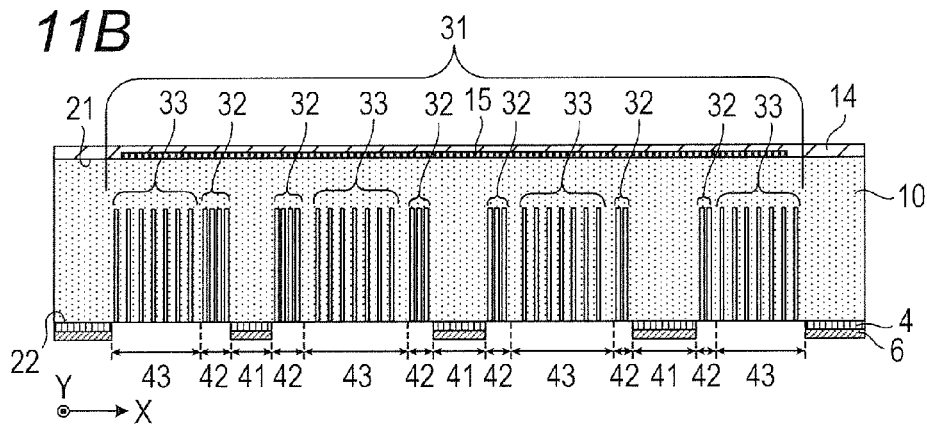
FIGS. 11B and 11C are each a sectional view thereof.
Figure 11C:
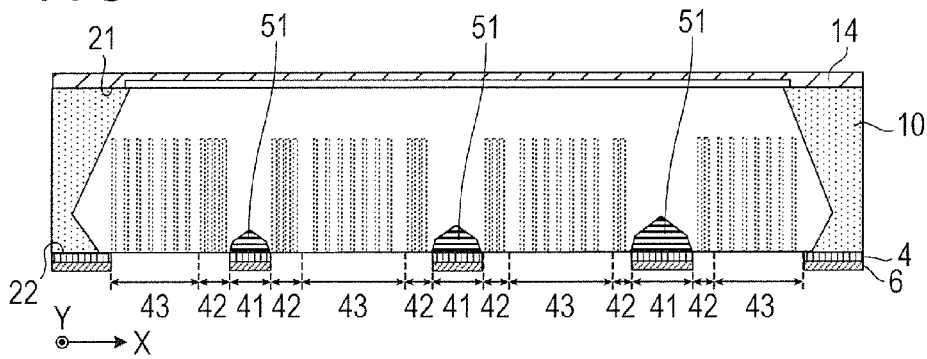
Figure 11D:
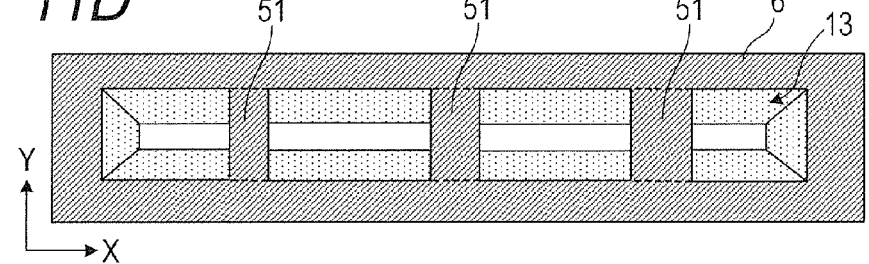

In the case where the first region 41 and the second regions 42 on both sides of the first region 41 are considered as one group, and a plurality of such groups are set in the single supply path forming region, different dimensions in the longitudinal direction (X direction) of the supply path forming region can be set with respect to each group of the first region 41 and the second regions 42. That is, a plurality of beams 51 having different dimensions and shapes can be formed in the supply path 13. In Embodiment 6, three beams 51 are provided in the supply path 13 in the same manner as in Embodiment 5, but Embodiment 6 is different from Embodiment 5 in that the dimensions and the shapes of the respective beams 51 are different from each other. FIG. 11A to FIG. 11D are each a view for illustrating a forming process of the supply path 13 and the beams 51 in Embodiment 6. FIG. 11A and FIG. 11B are each a view for illustrating a state after the non-through hole forming step is completed and before the etching step is started and for illustrating the arrangement of the non-through holes 32 in the second region 42 and the arrangement of the non-through holes 33 in the third region 43. FIG. 11B is a sectional view taken along the line F-F' of FIG. 11A. FIG. 11C is a sectional view for illustrating a state after the anisotropic etching is completed, and FIG. 11D is a plan view of the silicon substrate 10 illustrated in FIG. 11C viewed from the second surface 22 side. The forming idea and forming method of the supply path 13 and the beams 51 in Embodiment 6 are the same as those of Embodiments 4 and 5, and two or four or more beams 51 may also be formed. In this embodiment, at least two beams 51 are provided in the supply path 13, and at least one of the beams 51 can be made different in at least one of a dimension or a shape from another beam 51 in the supply path 13.

Embodiment 7

In Embodiment 1 described above, the dimension of the beam 51 is controlled by changing the arrangement interval of the non-through holes 32 in the second region 42 and the arrangement interval of the non-through holes 33 in the third region 43. However, the method of controlling the dimension of the beam 51 is not limited thereto, and in the processing method of the present invention, the dimension of the beam 51 can be controlled by varying the depth of the non-through holes between the second region 42 and the third region 43. In Embodiment 7, the dimension of the beam 51 is controlled by controlling the depth of the non-through holes 31.

Figure 12A:
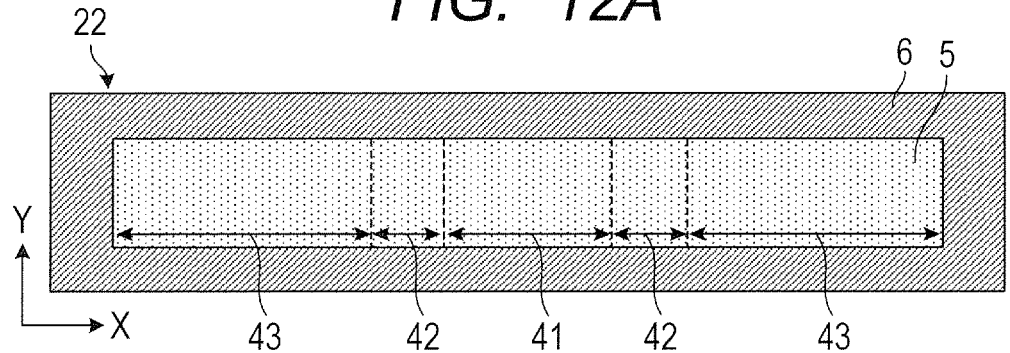
FIGS. 12A and 12B are each a plan view of a second surface of a silicon substrate for illustrating arrangement of non-through holes in Embodiment 7 of the present invention.
Figure 12B:
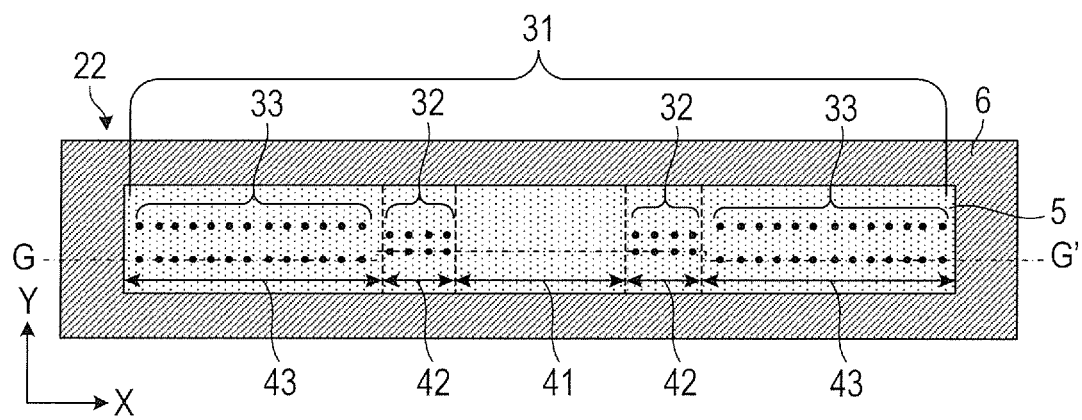
Figure 12C:
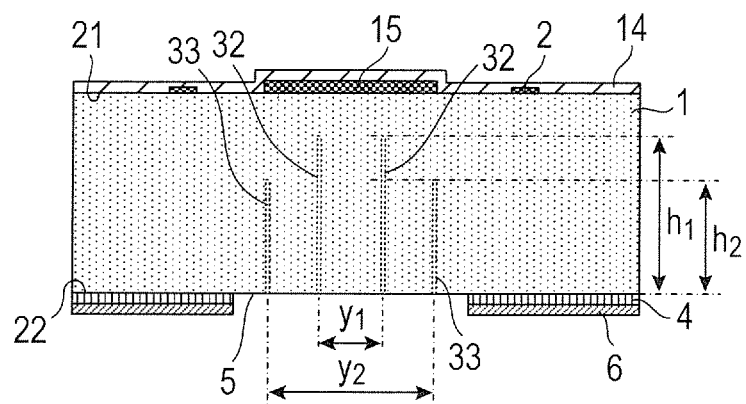
FIG. 12C is a sectional view thereof.
Figure 13A:
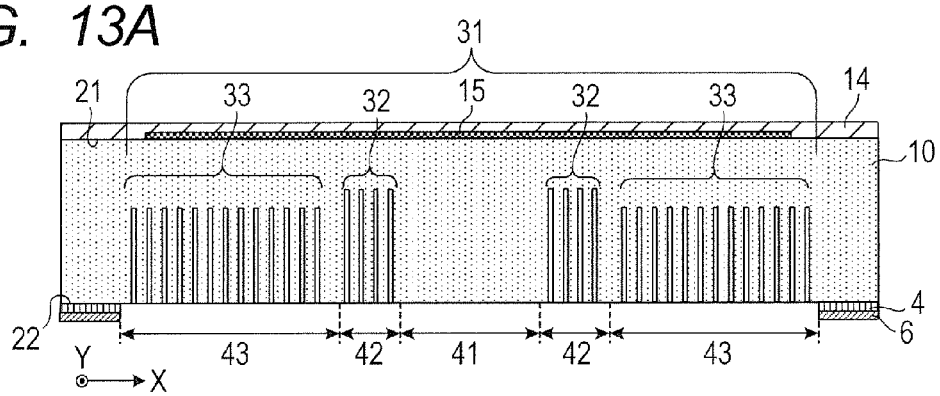
FIGS. 13A, 13B, 13C and 13D are each a sectional view for illustrating a forming process of a supply path and a beam in Embodiment 7.

Energy generating elements are formed in advance on the first surface 21 in the same manner as in Embodiment 1. The elongated rectangular silicon substrate 10 having a surface whose crystal orientation is a (100) plane is prepared. FIG. 12A and FIG. 12B are each a plan view of the second surface 22 in the same manner as in FIG. 2A to FIG. 2C, and FIG. 12C is a sectional view thereof. FIG. 13A to FIG. 13D are each a sectional view for illustrating a forming process of the supply path 13 and the beams 51 step-by-step in the same manner as in FIG. 3A to FIG. 3D. As illustrated in FIG. 12C and FIG. 13A, the oxide film 4 made of, for example, $SiO_2$ is formed in a part of the second surface 22 of the silicon substrate 10. A region in which the oxide film 4 is not formed corresponds to the opening 5 in the oxide film 4 and has a slit-like shape extending in the X direction. In this embodiment, the region of the opening 5 is matched with a supply path forming region in which the supply path 13 is to be formed by anisotropic etching described later. In the second surface 22, the protective film 6 may be formed on the oxide film 4 although not necessary. The protective film 6 is not formed at the position of the opening 5. As the protective film 6, for example, a polyether amide resin can be used. In this embodiment, the configuration in which the protective film 6 is formed is considered.

Also in this embodiment, the region of the opening 5, that is, the supply path forming region is partitioned into the first region 41, the second region 42, and the third region 43 in the same manner as in Embodiment 1, as illustrated in FIG. 12A. The regions 41 to 43 are defined in the longitudinal direction (X direction) of the supply path forming region. The first region 41 is defined as a beam forming region corresponding to the forming position of the beam 51. The second region 42 is defined as a region in the vicinity of the first region 41. Each region that is adjacent to the first region 41 on both sides of the first region 41 corresponds to the second region 42. The third region 43 is defined as a region obtained by excluding the first region 41 and the second region 42 from the supply path forming region. Through the definition described above, the number of the first regions 41 to be set in the single opening 5 becomes the number of the beams 51 to be formed in the supply path 13.

The sacrificial layer 15 may be formed in a part of the first surface 21 of the silicon substrate 10 in the same manner as in Embodiment 1. The position at which the sacrificial layer 15 is to be formed corresponds to, for example, a region in the first surface 21 corresponding to the position at which the supply path 13 is to be formed. In this embodiment, the configuration in which the sacrificial layer 15 is formed is considered. Through provision of the sacrificial layer 15, as described in Embodiment 1, the formation of the beam 51 can be accelerated, and the opening width of the supply path 13 can be controlled more satisfactorily. As the sacrificial layer 15, the same layer as that used in Embodiment 1 can be used, and a void portion may be formed in place of the sacrificial layer 15. The sacrificial layer 15 is covered with the passivation layer 14 (etching stop layer) having etching resistance. As the passivation layer 14, there is given, for example, SiO₂ or SiN. The passivation layer 14 is directly provided on the first surface 21 at a position where the sacrificial layer 15 is not provided.

In this embodiment, in the opening 5 of the second surface 22 of the silicon substrate 10, that is, in the supply path forming region, a plurality of non-through holes 31 that do not penetrate through the silicon substrate 10 are formed from the opening 5 side. As a non-through hole forming method, the processing method using irradiation of laser light described in Embodiment 1 can be used. As the non-through holes 31 are deeper, in other words, the tip ends of the non-through holes 31 are closer to the first surface 21 of the silicon substrate 10, the time required for the non-through holes 31 to arrive at the sacrificial layer 15 by the anisotropic etching is shortened. That is, the processing time of the anisotropic etching is shortened. Therefore, it is preferred that the depth of the non-through holes 31 be set to from about 40% to about 95% of the thickness of the silicon substrate 10 while the conditions described later are satisfied. In this embodiment, of the non-through holes 31, the non-through holes processed in the second region 42 are defined as the non-through holes 32, and the non-through holes processed in the third region 43 are defined as the non-through holes 33. The non-through holes 31 may also be processed in the first region 41, but it is preferred that the non-through holes 31 not be formed in the first region 41 from the viewpoint of the balance with the second region 42. In Embodiment 7, the case where the number of the beams 51 to be formed in the supply path 13 is one, that is, the case where the number of the first regions 41 to be set in the single opening 5 is one is considered. Each of the first region 41 and the second region 42 can be set in at least one portion at any position within the opening 5, as long as the first region 41 and the second region 42 are set within the opening 5, which is illustrated in the other embodiments described later.

It is preferred that the non-through holes 31 be arranged substantially symmetrically with respect to a center line of the opening 5 along the longitudinal direction (X direction) from the viewpoint of the forming accuracy and the uniformity of the supply path 13 and the beam 51. It is preferred that the arrangement interval of the non-through holes 31 be set within the region of the opening 5 in consideration of the diameter of the non-through holes 31, the processing position accuracy of a processing device by the irradiation of laser light, the alignment accuracy, and the like so that the adjacent non-through holes 31 do not overlap each other. It is preferred that the diameter of the non-through holes 31 to be processed onto the silicon substrate 10 be from about 5 μm to about 100 μm. In this embodiment, the arrangement interval of the non-through holes 31 is defined as a shortest distance between centers of the adjacent non-through holes 31 for each of the regions 42 and 43 in each of the X direction and the Y direction. Further, the arrangement interval of the non-through holes 31 may also be different in the X direction and the Y direction.

Next, the anisotropic etching is performed from the second surface 22 of the silicon substrate 10. As an etchant to be used in the anisotropic etching, there are given, for example, strong alkaline solutions such as TMAH and KOH in the same manner as in Embodiment 1. Then, as described in Embodiment 1, when the etching proceeds, and the etching surface arrives at the sacrificial layer 15, the supply path 13 is formed. In this embodiment, in order for the beam 51 to be formed simultaneously with the supply path 13, the arrangement and the depth of the non-through holes 31 in the supply path forming region of the second surface 22 are determined. FIG. 12A to FIG. 12C are each an illustration of the arrangement and the depth of the non-through holes 31 in the second surface 22. The dimension of the supply path forming region, that is, the opening 5 is determined by the arrangement of the ejection orifices 11 in the liquid ejection head 1 to be formed and the intended dimension of the supply path 13. Therefore, the dimension of the opening 5 is not particularly limited, but the dimension of the opening 5 in the X direction illustrated in the figures, that is, a direction along an ejection orifice row is preferably from about 5 mm to about mm, and the dimension of the opening 5 in the Y direction illustrated in the figures is preferably from about 200 μm to about 1.5 mm.

Next, the first region 41, the second region 42, and the third region 43 to be set in the opening 5 of the second surface 22 of the silicon substrate 10 are described. The first region 41 corresponds to a region in which the beam 51 is to be formed in the supply path 13. The width and height of the beam 51 to be formed can be adjusted by the first region 41. The longitudinal dimension of the first region 41 can be set arbitrarily, but is preferably from about 600 μm to about 3 mm.

The second region 42 is a region for assisting in formation of the beam 51 at a position from the first surface 21 to the second surface 22 with high accuracy by etching performed from the sacrificial layer 15 side of the first surface 21 at time of formation of the beam 51 in the first region 41. Therefore, it is preferred that the depth of the non-through holes 32 in the second region 42 be larger than that of the non-through holes 31 in the other regions. The purpose of this configuration is to cause the etching surface to arrive at the sacrificial layer 15 faster in the second region 42 as compared to the third region 43 by the anisotropic etching to be performed after the non-through hole forming step, as described above. With this, the anisotropic etching from the first surface 21 side of the first region 41 using side etching of the sacrificial layer 15 from the second region 42 can be performed before the etching surface arrives at the sacrificial layer 15 in the third region 43.

The third region 43 corresponds to a region in which only the supply path 13 is to be formed. Relationships in processing position and depth between the non-through holes 33 in the third region 43 and the non-through holes 32 in the second region 42 are described with reference to FIG. 12C. FIG. 12C is a view for illustrating each depth of the non-through holes 32 and 33, and is a perspective sectional view on a plane perpendicular to the G-G' line of FIG. 12B. The energy generating element 2 formed in advance on the first surface 21 of the silicon substrate 10 is also illustrated in FIG. 12C. The depth and interval of the non-through holes 32 are defined as $h_1$ and $y_1$, respectively, and the depth and interval of the non-through holes 33 are defined as $h_2$ and $y_2$, respectively. As described above, it is necessary that the non-through holes 32 in the region (second region 42) adjacent to the beam forming region (first region 41) be formed deeper than the non-through holes 33. In this case, it is necessary to control the processing interval so that a side surface to be formed with a plane orientation (111) of the opening 5 formed by the anisotropic etching becomes a uniform surface. Symbols $h_1$, $y_1$, $h_2$, and $y_2$ have the following relationship.

$$(y_2 - y_1)/2 = 1.41 \times (h_1 - h_2)$$

It is necessary that such relationship be substantially satisfied while $h_1 > h_2$ is satisfied. Symbols $h_1$, $y_1$, $h_2$, and $y_2$ vary depending on the thickness of the silicon substrate 10, the opening width required in the supply path 13 in the first surface 21, and the plane orientation of the silicon substrate 10.

Figure 13B:
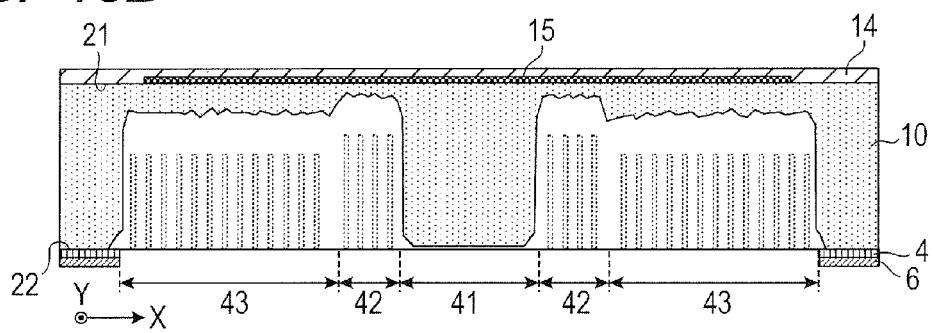
Figure 13C:
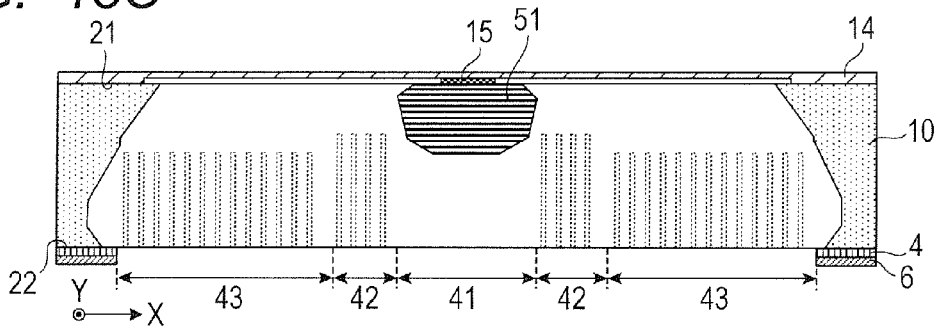

Next, a forming process of the beam 51 in Embodiment 7 is described in more detail. FIG. 13A to FIG. 13D are each a sectional view for schematically illustrating a forming process of the supply path 13 and the beam 51 step-by-step through the non-through hole forming step and the etching step in Embodiment 7, and FIG. 14A to FIG. 14C are each an illustration of the supply path and the beam 51 thus formed. The arrangement, the dimension, and the interval of the non-through holes 31 of each of the regions 41 to 43 in the opening 5 are the same as those described above, and each sectional view of FIG. 13A to FIG. 13D and FIG. 14A corresponds to a cross-section taken along the line G-G' of FIG. 12B. The depth of the non-through holes 31 can be set as described above in consideration of the thickness of the silicon substrate 10, the intended shape of the flow path 13, the shape of the beam 51, the anisotropic etching time, the interval of the non-through holes 31, and the like. The anisotropic etching conditions can be similarly set appropriately in consideration of the intended shape of the supply path 13, the shape of the beam 51, the etching time, the interval of the non-through holes, and the like.

FIG. 13A is an illustration of the state after the non-through hole forming step is completed and before the etching step is started. When the anisotropic etching of the silicon substrate 10 is started from the second surface 22, silicon is gradually etched and removed from the silicon substrate 10 through the non-through holes 31 and the opening 5 of the second surface 22. FIG. 13B is an illustration of a stage in the middle of the etching. In this state, in the second region 42 and the third region 43, the etching surface of the anisotropic etching has not arrived at the sacrificial layer 15. Contours of the non-through holes 31 before the start of the etching are represented by the dotted line in FIG. 13B. In this case, the depth of the non-through holes 32 in the second region 42 is larger than that of the non-through holes 33 in the third region 43, and hence the anisotropic etching in the thickness direction of the silicon substrate 10 proceeds faster in the second region 42 as compared to the third region 43. FIG. 13C is an illustration of a state in which the anisotropic etching is performed further for about 2 hours after the state illustrated in FIG. 13B. In the state illustrated in FIG. 13C, the etching surface has arrived at the sacrificial layer 15 in any of the second region 42 and the third region 43. In the first region 41, the anisotropic etching proceeds from the second surface 22 side of the silicon substrate 10 to the first surface 21 side thereof. Further, in a direction perpendicular to the thickness direction of the silicon substrate 10, the etching from the first surface 21 side caused by the side etching from the second region 42 and the side etching of the sacrificial layer 15 in the first region 41 also proceeds. As a result, three higher-order planes are formed in the thickness direction of the silicon substrate 10, and the beam 51 is formed in the first region. Note that, in this state, the sacrificial layer 15 in the beam portion has not been completely etched, and a surface of the beam 51 closest to the first surface 21 is flush with the first surface 21.

Figure 13D:
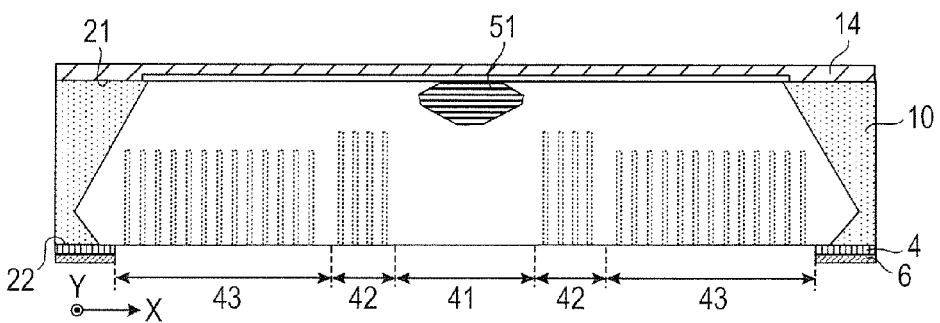
Figure 14A:
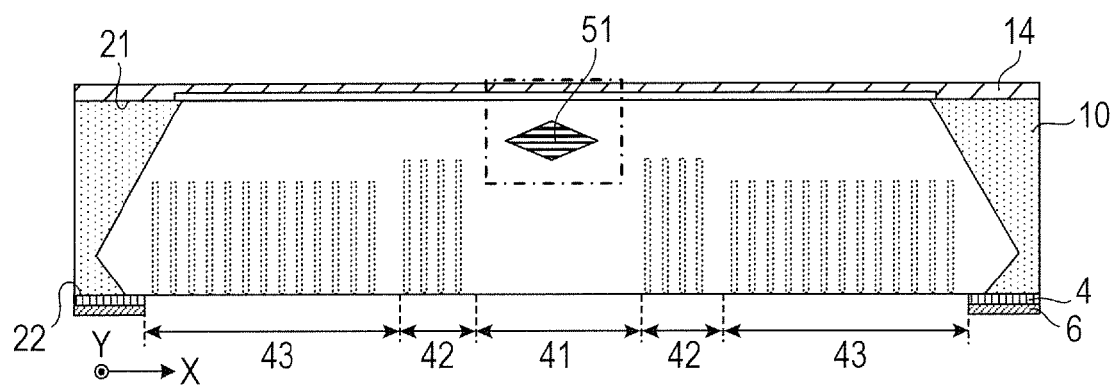
FIG. 14A is a sectional view for illustrating the supply path and the beam formed in Embodiment 7.
Figure 14B:
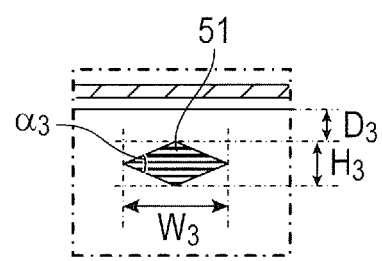
FIG. 14B is an enlarged view of a region surrounded by the dot-and-dash line of FIG. 14A.
Figure 14C:
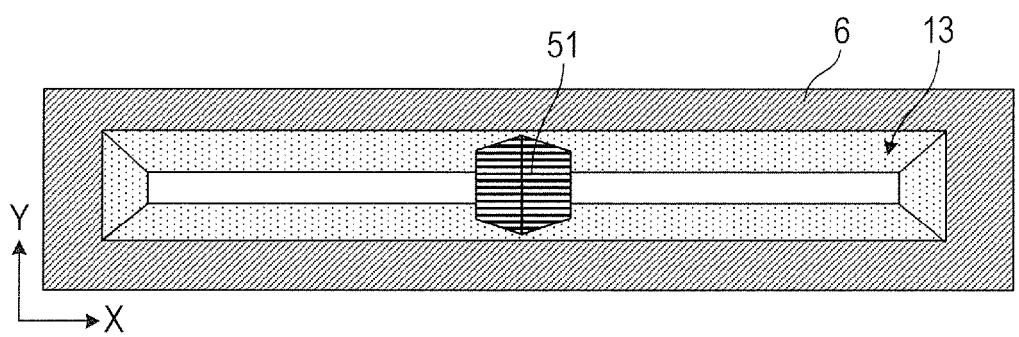
FIG. 14C is a plan view of the second surface of the silicon substrate corresponding to FIG. 14A.

FIG. 13D is an illustration of a state in which the anisotropic etching is performed further for about 2 hours after the state illustrated in FIG. 13C. In the state illustrated in FIG. 13D, the etching from the first surface 21 side (sacrificial layer 15 side) and the etching from the second surface 22 side in addition to the side etching from the second region 42 further proceed. As a result, the sacrificial layer 15 is eliminated completely, and the beam 51 becomes smaller. FIG. 14A is an illustration of a state after the anisotropic etching is performed further for about 2 hours, and the supply path 13 and the beam 51 thus formed are illustrated. In this case, a sectional shape of the beam 51 is a rhombic shape having a major axis in the X direction, and the beam 51 extends in the Y direction in the supply path 13 so as to connect opposed sides (sides extending in the X direction in this case) of the supply path 13. FIG. 14B is an illustration of a portion surrounded by the dot-and-dash line in FIG. 14A in an enlarged manner. The reason that the cross-section of the beam 51 becomes a rhombic shape is that the etching further proceeds from the state illustrated in FIG. 13D, and the etching speed on a surface in which the etching speed is high is limited. As illustrated in FIG. 14B, a dihedral $\alpha_2$ of the beam 51 in the rhombic cross-section was about 50°. From this, it can be confirmed that the beam 51 is formed on a surface different from a Si(111) plane under beam forming conditions of Embodiment 7. The final shape of the beam 51 to be formed is determined by the plane orientation and the material of the silicon substrate 10, the anisotropic etching conditions, and the like. That is, the shape of the beam 51 can be adjusted by changing the elements described above. Further, the position of an apex closest to the first surface 21 in the sectional shape of the beam 51 is retracted toward the second surface 22 from the surface position of the first surface 21. After this, when the passivation layer 14 is removed in accordance with the forming position of the supply path 13, the supply path 13 that penetrates through the silicon substrate 10 and is configured to supply a liquid from the second surface 22 side to the first surface side is completed, with the result that the substrate for a liquid ejection head is completed.

In Embodiment 7, the dimension in the cross-section in the X direction of the beam 51 formed in the supply path 13 is defined as illustrated in FIG. 14B. The shortest distance between the surface position of the first surface 21 and the beam 51 in the thickness direction of the silicon substrate 10 is defined as a beam depth $D_3$. The outermost dimension of the beam 51 in the thickness direction of the silicon substrate 10 is defined as a beam height $H_3$. The outermost dimension of the beam 51 in a direction (X direction) perpendicular to the thickness direction of the silicon substrate 10 is defined as a beam width $W_3$. It is preferred that the beam depth $D_3$ be set to 50 μm or more in the application of the substrate for a liquid ejection head from the viewpoint of the ejection function such as refill characteristics at time of ejection of a liquid from the ejection orifices 11. It is preferred that the beam height $H_3$ and the beam width $W_3$ be set to 100 μm or more from the viewpoint of the enhancement of reliability such as mechanical strength of the liquid ejection head 1. It is necessary to determine the dimension of the beam 51 in further consideration of the characteristics, such as the influence of the dissolution of silicon into a liquid that is to be actually ejected from a liquid ejection head, the expected age of service of the liquid ejection head, and the like. FIG. 14C is a plan view of the silicon substrate 10 illustrated in FIG. 14A viewed from the second surface 22 side.

Embodiment 8

Figure 15A:
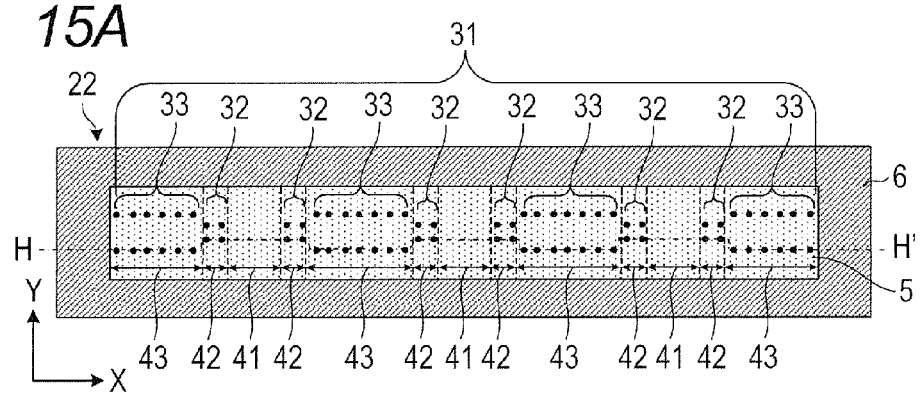
FIGS. 15A and 15D are each a plan view of a second surface of a silicon substrate for illustrating a forming process of a supply path and a beam in Embodiment 8 of the present invention.
Figure 15B:
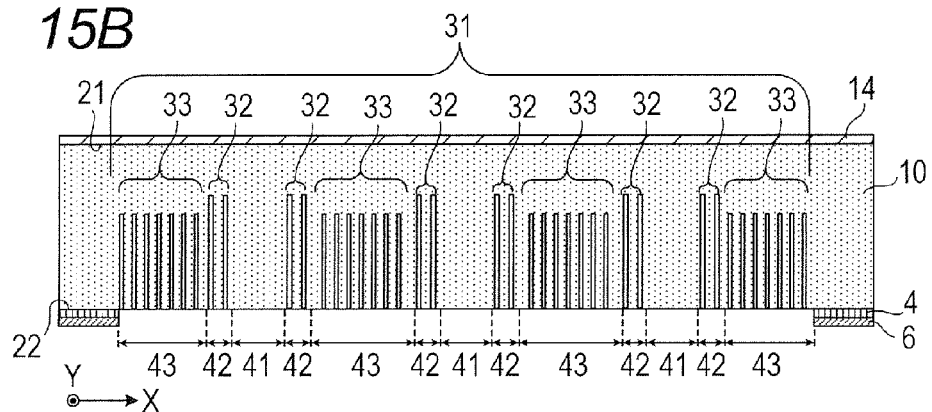
FIGS. 15B and 15C are each a sectional view thereof.
Figure 15C:
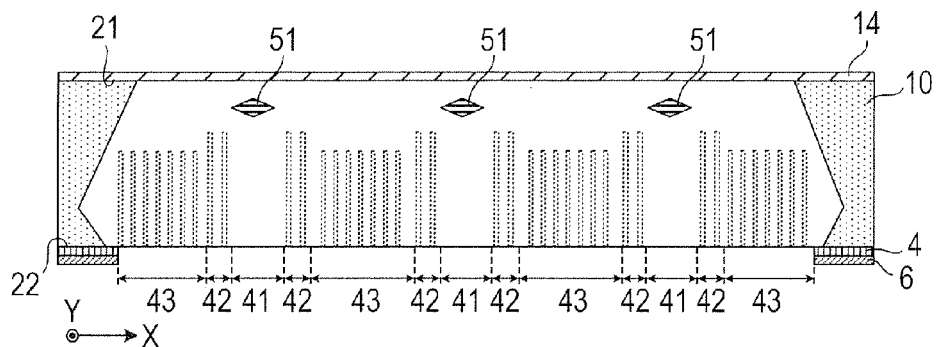
Figure 15D:
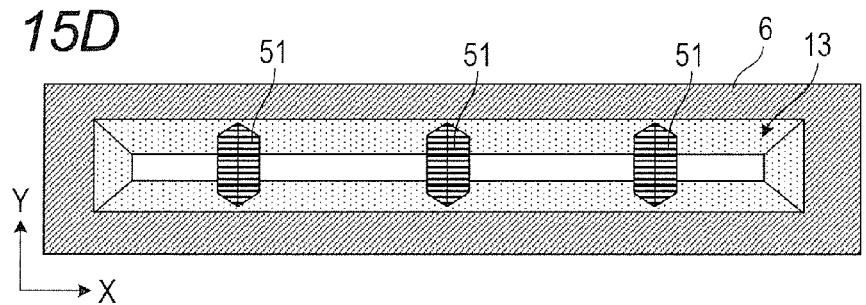

In Embodiment 7 described above, one first region 41 serving as the beam forming region is set in the single opening 5, and the second regions 42 are respectively set on both sides of the first region 41. In this case, in the case where the first region 41 and the second regions 42 on both sides of the first region 41 are considered as one group, a plurality of such groups may also be set in the single opening 5. That is, a plurality of beams 51 may also be provided in the supply path 13. Embodiment 8 is similar to Embodiment 7, but Embodiment 8 is different from Embodiment 7 in that three beams 51 are provided in the supply path 13. FIG. 15A to FIG. 15D are each a view for illustrating the forming process of the supply path 13 and the beams 51 in Embodiment 8. FIG. 15A and FIG. 15B are each a view for illustrating a state after the non-through hole forming step is completed and before the etching step is started in the same manner as in FIG. 12B and FIG. 13A of Embodiment 7, and for illustrating a formed state of the non-through holes 31 in each of the regions 41 to 43. FIG. 15B is a sectional view taken along the line H-H' of FIG. 15A. FIG. 15C is a sectional view for illustrating a state after the anisotropic etching is completed, and FIG. 15D is a plan view of the silicon substrate 10 illustrated in FIG. 15C viewed from the second surface 22 side. Embodiment 8 is the same as Embodiment 7 with the exception that three first regions 41 are provided in the opening 5, and that the second regions are respectively disposed on both sides of each of the first regions 41. Thus, the forming idea and forming method of the supply path 13 and the beams 51 in Embodiment 8 are the same as those of Embodiment 7, and two or four or more beams 51 may also be formed.

Embodiment 9

Figure 16A:
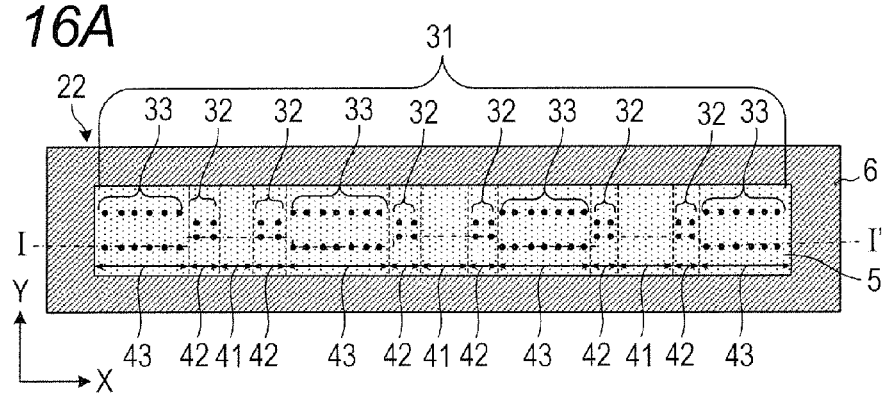
FIGS. 16A and 16D are each a plan view of a second surface of a silicon substrate for illustrating a forming process of a supply path and a beam in Embodiment 9 of the present invention.
Figure 16B:
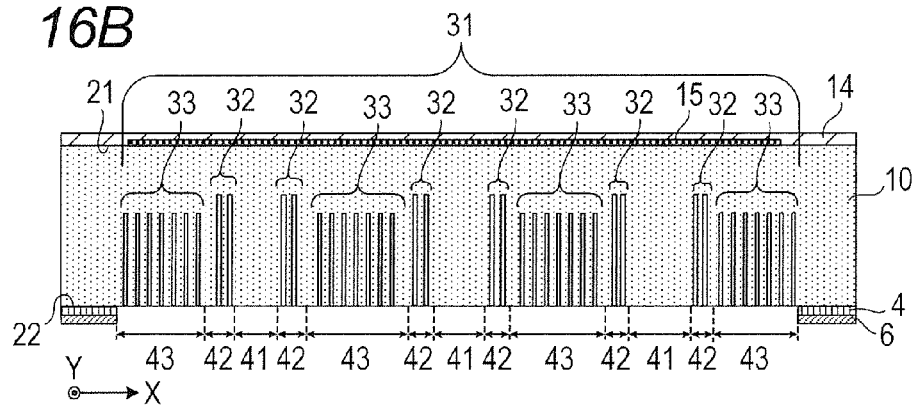
FIGS. 16B and 16C are each a sectional view thereof.
Figure 16C:
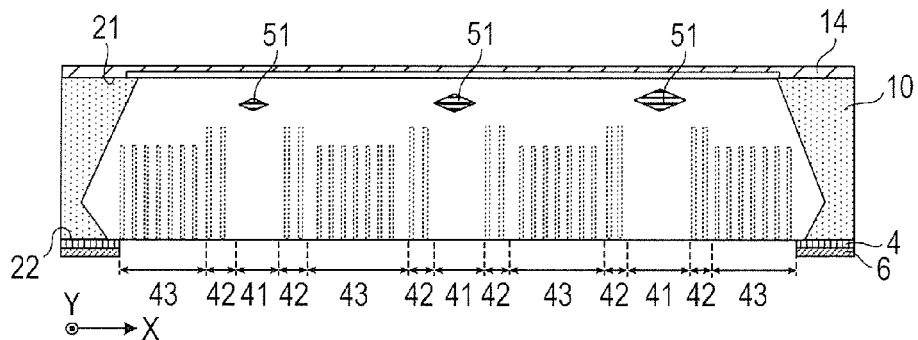
Figure 16D:
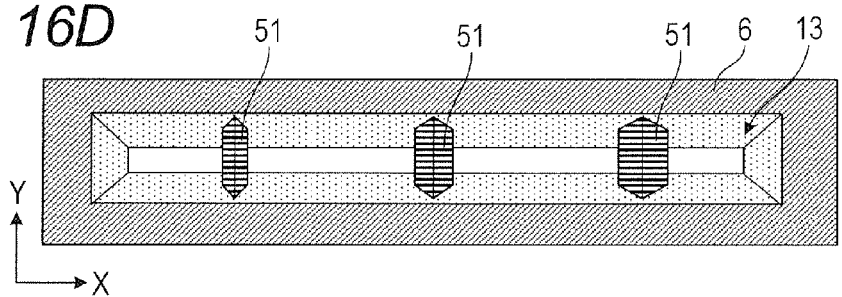

In the case where the first region 41 and the second regions 42 on both sides of the first region 41 are considered as one group, and a plurality of such groups are set in the single supply path forming region, different dimensions in the longitudinal direction (X direction) of the supply path forming region can be set with respect to each group of the first region 41 and the second regions 42. That is, a plurality of beams 51 having different dimensions and shapes can be formed in the supply path 13. In Embodiment 9, three beams 51 are provided in the supply path 13 in the same manner as in Embodiment 8, but Embodiment 9 is different from Embodiment 8 in that the dimensions and the shapes of the respective beams 51 are different from each other. FIG. 16A to FIG. 16D are each a view for illustrating a forming process of the supply path 13 and the beams 51 in Embodiment 9. FIG. 16A and FIG. 16B are each a view for illustrating a state after the non-through hole forming step is completed and before the etching step is started and for illustrating the arrangement of the non-through holes 32 in the second region 42 and the arrangement of the non-through holes 33 in the third region 43. FIG. 16B is a sectional view taken along the line I-I' of FIG. 16A. FIG. 16C is a sectional view for illustrating a state after the anisotropic etching is completed, and FIG. 16D is a plan view of the silicon substrate 10 illustrated in FIG. 16C viewed from the second surface 22 side. The forming idea and forming method of the supply path 13 and the beams 51 in Embodiment 9 are the same as those of Embodiments 7 and 8, and two or four or more beams 51 may also be formed. In this embodiment, at least two beams 51 are provided in the supply path 13, and at least one of the beams 51 can be made different in at least one of a dimension or a shape from another beam 51 in the supply path 13.

Embodiment 10

In Embodiment 7, the beam 51 is formed at the position which is retracted from the first surface 21 of the silicon substrate 10 to the second surface 22 thereof in the supply path 13 but is closer to the first surface 21 as compared to the second surface 22. The forming position of the beam 51 in the thickness direction of the silicon substrate 10 is not limited thereto, and the beam 51 can also be provided so as to be substantially brought into contact with the surface position of the second surface 22. In Embodiment 10, the beam 51 is provided on the side closer to the second surface 22 in the supply path 13.

Figure 17A:
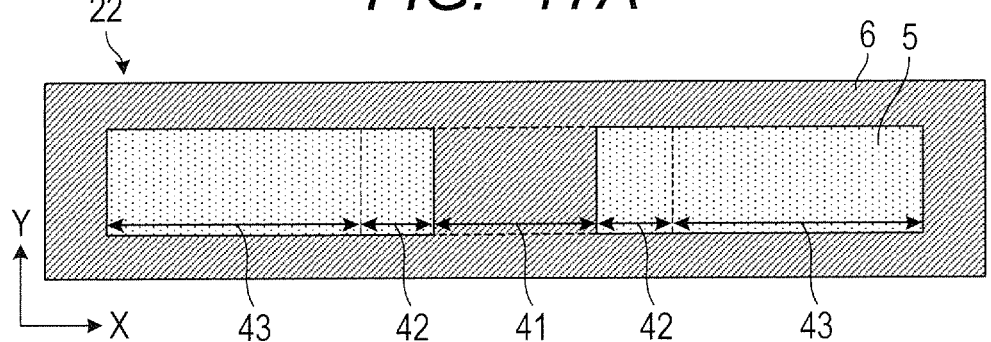
FIGS. 17A and 17B are each a plan view of a second surface of a silicon substrate for illustrating arrangement of non-through holes in Embodiment 10 of the present invention.
Figure 17B:
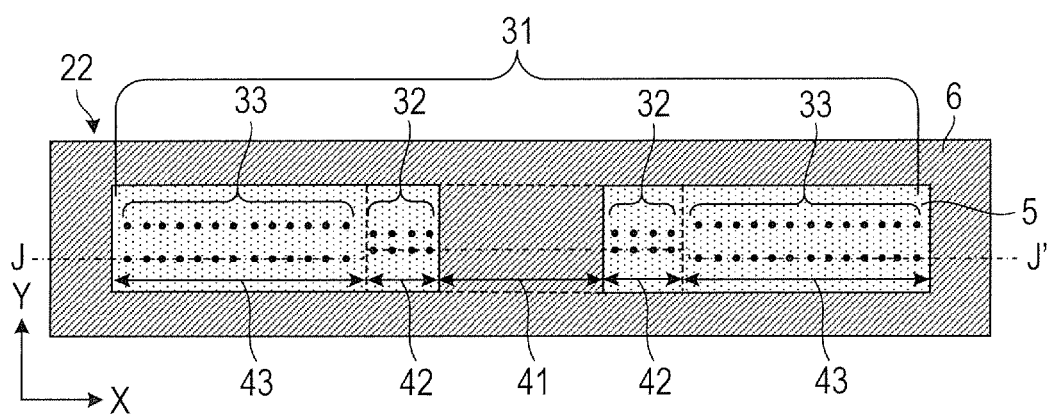
Figure 17C:
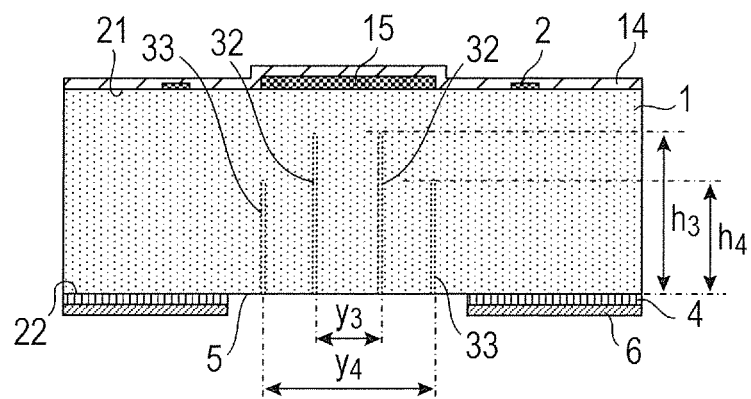
FIG. 17C is a sectional view thereof.

Energy generating elements are formed in advance on the first surface 21 in the same manner as in Embodiment 7. The elongated rectangular silicon substrate 10 having a surface whose crystal orientation is a (100) plane is prepared. FIG. 17A and FIG. 17B are each a plan view of the second surface 22 and FIG. 17C is a sectional view thereof in the same manner as in FIG. 12A to FIG. 12C. FIG. 18A to FIG. 18D are each a sectional view for illustrating a forming process of the supply path 13 and the beam 51 step-by-step in the same manner as in FIG. 13A to FIG. 13D. In this embodiment, the supply path forming region in which the supply path 13 is to be formed by anisotropic etching described later also has a slit-like shape extending in the X direction in the same manner as in Embodiment 7, and as illustrated in FIG. 17A, the supply path forming region is partitioned into the first region 41, the second region 42, and the third region 43. The regions 41 to 43 are defined in the longitudinal direction (X direction) of the supply path forming region. The first region 41 is defined as a beam forming region corresponding to the forming position of the beam 51. The second region 42 is defined as a region in the vicinity of the first region 41. Each region that is adjacent to the first region 41 on both sides of the first region 41 corresponds to the second region 42. The third region 43 is defined as a region obtained by excluding the first region 41 and the second region 42 from the supply path forming region. Through the definition described above, the number of the first regions 41 to be set in the supply path forming region becomes the number of the beams 51 to be formed in the supply path 13.

In this embodiment, the oxide film 4 made of, for example, $SiO_2$ is also provided in a part of the second surface 22. However, unlike Embodiment 7, the oxide film 4 is provided in a region besides the supply path forming region in the second surface 22, and is also provided in the first region 41 serving as the beam forming region in the supply path forming region. Thus, the opening 5 in the oxide film 4 corresponds to the second region 42 and the third region 43 of the supply path forming region. Further, the protective film 6 may be formed on the oxide film 4 although not necessary. As the protective film 6, for example, a polyether amide resin can be used. In this embodiment, the configuration in which the protective film 6 is formed is considered.

The sacrificial layer 15 may be formed in a part of the first surface 21 of the silicon substrate 10 in the same manner as in Embodiment 7. The position at which the sacrificial layer 15 is to be formed corresponds to, for example, a region in the first surface 21 corresponding to the position at which the supply path 13 is to be formed. In this embodiment, the configuration in which the sacrificial layer 15 is formed is considered. Through provision of the sacrificial layer 15, as described in Embodiment 1, the formation of the beam 51 can be accelerated, and the opening width of the supply path 13 can be controlled more satisfactorily. As the sacrificial layer 15, the same layer as that used in Embodiment 1 can be used, and a void portion may be provided in place of the sacrificial layer 15. The sacrificial layer 15 is covered with the passivation layer 14 (etching stop layer) having etching resistance. As the passivation layer 14, there is given, for example, $SiO_2$ or SiN. The passivation layer 14 is directly provided on the first surface 21 at a position where the sacrificial layer 15 is not provided.

In this embodiment, in the opening 5 of the second surface 22 of the silicon substrate 10, that is, in the second region 42 and the third region 43 of the supply path forming region, a plurality of non-through holes 31 that do not penetrate through the silicon substrate 10 are formed from the opening 5 side. As a non-through hole forming method, the processing method using irradiation of laser light described in Embodiment 1 can be used. As the non-through holes 31 are deeper, the time required for the non-through holes 31 to arrive at the sacrificial layer 15 by the anisotropic etching is shortened. That is, the processing time of the anisotropic etching is shortened. Therefore, it is preferred that the depth of the non-through holes 31 be set to a depth of from about 40% to about 95% of the thickness of the silicon substrate 10 while conditions described later are satisfied. In this embodiment, of the non-through holes 31, the non-through holes to be processed in the second region 42 are defined as the non-through holes 32, and the non-through holes to be processed in the third region 43 are defined as the non-through holes 33. In Embodiment 10, the case where the number of the beams 51 to be formed in the supply path 13 is one, that is, the case where the number of the first regions 41 to be set in the single supply path forming region is one is considered. Each of the first region 41 and the second region 42 can be set in at least one portion at any position within the supply path forming region, as long as the supply path 13 falls within a range of conditions to be satisfied, which is illustrated in the other embodiments described later.

It is preferred that the non-through holes 31 be arranged substantially symmetrically with respect to a center line of the opening 5 along the longitudinal direction (X direction) from the viewpoint of the forming accuracy and the uniformity of the supply path 13 and the beam 51. It is preferred that the arrangement interval of the non-through holes 31 be set within the region of the opening 5 in consideration of the diameter of the non-through holes 31, the processing position accuracy of a processing device by the irradiation of laser light, the alignment accuracy, and the like so that the adjacent non-through holes 31 do not overlap each other. It is preferred that the diameter of the non-through holes 31 to be processed onto the silicon substrate 10 be from about 5 µm to about 100 µm. In this embodiment, the arrangement interval of the non-through holes 31 is defined as a shortest distance between centers of the adjacent non-through holes 31 for each of the regions 42 and 43 in each of the X direction and the Y direction. Further, the arrangement interval of the non-through holes 31 may also be different in the X direction and the Y direction.

Next, the anisotropic etching is performed from the second surface 22 of the silicon substrate 10. As an etchant to be used in the anisotropic etching, there are given, for example, strong alkaline solutions such as TMAH and KOH in the same manner as in Embodiment 1. Then, as described in Embodiment 1, when the etching proceeds, and the etching surface arrives at the sacrificial layer 15, the supply path 13 is formed. In this embodiment, in order for the beam 51 to be formed simultaneously with the supply path 13, the shape of the first region 41 is determined, and the depth of the non-through holes 31 in the second region 42 and the third region 43 is determined. The dimension of the whole supply path forming region is determined by the arrangement of the ejection orifices 11 in the liquid ejection head 1 to be formed and the intended dimension of the supply path 13. Therefore, the dimension of the opening 5 is not particularly limited, but the dimension of the opening 5 in the X direction illustrated in the figures, that is, a direction along an ejection orifice row is preferably from about 5 mm to about 40 mm, and the dimension of the opening 5 in the Y direction illustrated in the figures is preferably from about 200 µm to about 1.5 mm.

Next, the first region 41, the second region 42, and the third region 43 to be set in the second surface 22 of the silicon substrate 10 are described. The first region 41 corresponds to a region in which the beam 51 is to be formed in the supply path 13, and the oxide film 4 and the protective film 6 are formed in the first region 41. The width and height of the beam 51 to be formed can be adjusted by the dimension of the first region 41. The dimension of the first region 41 in the X direction can be set arbitrarily, but is preferably from about 600 µm to about 3 mm.

The second region 42 is a region for assisting in formation of the beam 51 at a position from the first surface 21 to the second surface 22 with high accuracy by etching performed from the sacrificial layer 15 side of the first surface 21 at time of formation of the beam 51 in the first region 41. Therefore, due to the reason described in Embodiment 7, it is preferred that the depth of the non-through holes 32 in the second region 42 be larger than that of the non-through holes 31 in the other regions.

The third region 43 corresponds to a region in which only the supply path 13 is to be formed. Relationships in processing position and depth between the non-through holes 33 in the third region 43 and the non-through holes 32 in the second region 42 are described with reference to FIG. 17C. FIG. 17C is a view for illustrating each depth of the non-through holes 32 and 33, and is a perspective sectional view on a plane perpendicular to the J-J' line of FIG. 17B. The energy generating element 2 provided in advance on the first surface 21 of the silicon substrate 10 is also illustrated in FIG. 17C. The depth and interval of the non-through holes 32 are defined as $h_3$ and $y_3$, respectively, and the depth and interval of the non-through holes 33 are defined as $h_4$ and $y_4$, respectively. As described above, it is necessary that the non-through holes 32 in the region (second region 42) adjacent to the beam forming region (first region 41) be formed deeper than the non-through holes 33. In this case, it is necessary to control the processing interval so that a side surface to be formed with a plane orientation (111) of the opening 5 formed by the anisotropic etching becomes a uniform surface. Symbols $h_3$, $y_3$, $h_4$, and $y_4$ have the following relationship.

$$(y_4-y_3)/2=1.41\times(h_3-h_4)$$

It is necessary that such relationship be substantially satisfied while $h_3>h_4$ is satisfied. Symbols $h_3$, $y_3$, $h_4$, and $y_4$ vary depending on the thickness of the silicon substrate 10, the opening width required in the supply path 13 in the first surface 21, and the plane orientation of the silicon substrate 10.

Next, a forming process of the beam 51 in Embodiment 10 is described in more detail. FIG. 18A to FIG. 18D are each a sectional view for schematically illustrating a forming process of the supply path 13 and the beam 51 step-by-step through the non-through hole forming step and the etching step in Embodiment 10, and FIG. 19A to FIG. 19C are each an illustration of the supply path and the beam 51 thus formed. The arrangement, the dimension, and the interval of the non-through holes 31 of each of the regions 41 to 43 in the opening 5 are the same as those described above, and each sectional view of FIG. 18A to FIG. 18D and FIG. 19A corresponds to a cross-section taken along the line J-J' of FIG. 17B. The anisotropic etching conditions can be set appropriately in consideration of the intended shape of the supply path 13, the shape of the beam 51, the etching time, the interval of the non-through holes, and the like.

Figure 18A:
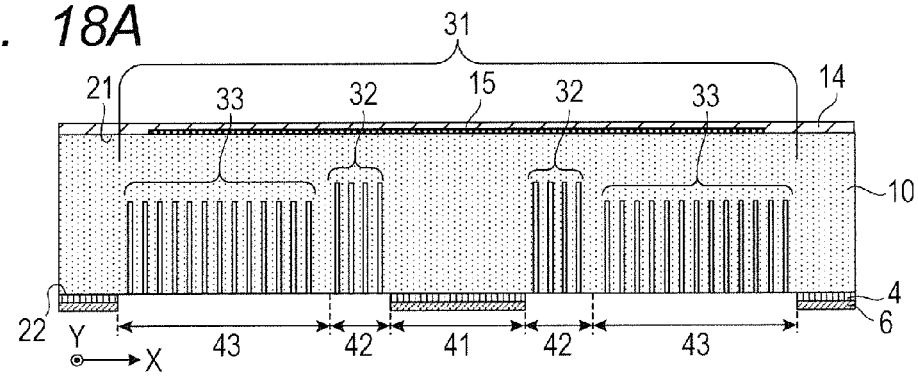
FIGS. 18A, 18B, 18C and 18D are each a sectional view for illustrating a forming process of a supply path and a beam in Embodiment 10.
Figure 18B:
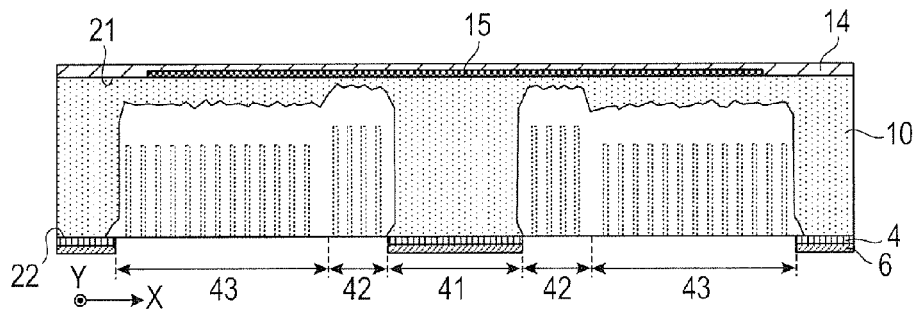
Figure 18C:
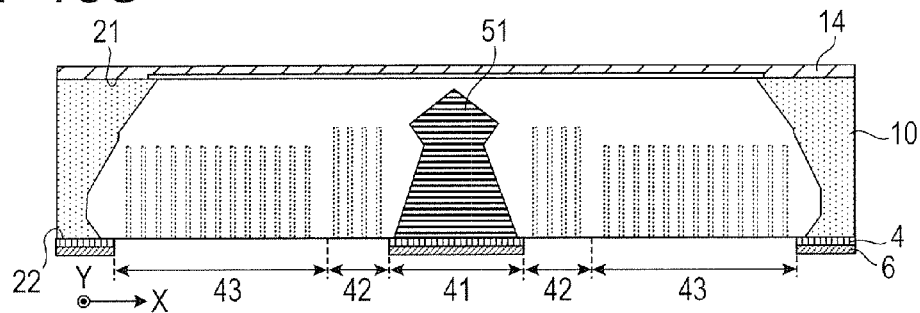
Figure 19A:
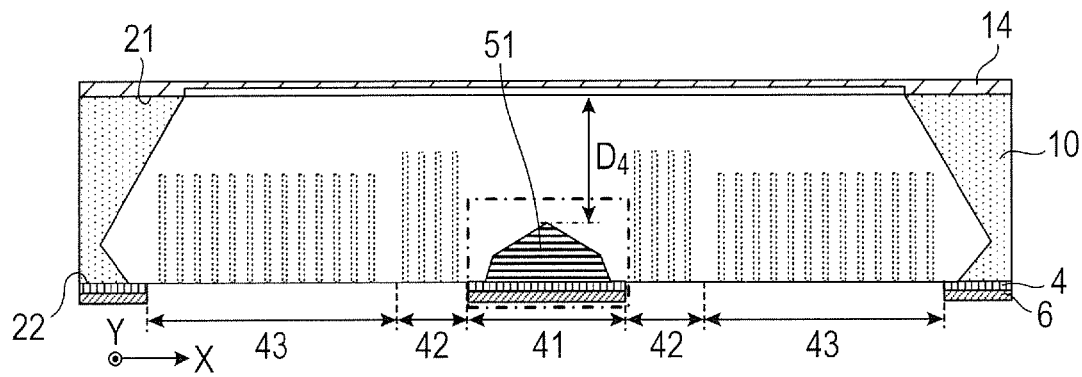
FIG. 19A is a sectional view for illustrating the supply path and the beam formed in Embodiment 10.
Figure 19B:
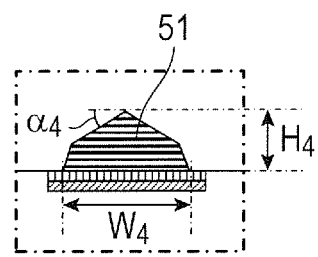
FIG. 19B is an enlarged view of a region surrounded by the dot-and-dash line of FIG. 19A.
Figure 19C:
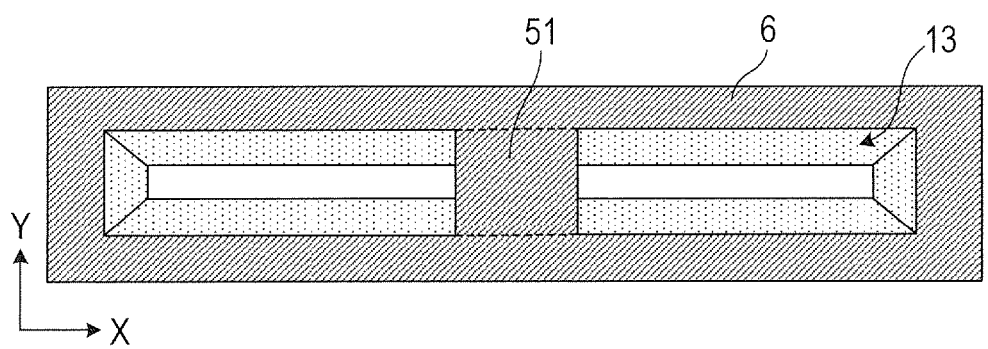
FIG. 19C is a plan view of the second surface of the silicon substrate corresponding to FIG. 19A.

FIG. 18A is an illustration of the state after the non-through hole forming step is completed and before the etching step is started. When the anisotropic etching of the silicon substrate 10 is started from the second surface 22, silicon is gradually etched and removed from the silicon substrate 10 through the non-through holes 31 and the opening 5 of the second surface 22. FIG. 18B is an illustration of a stage in the middle of the etching. In this state, in the second region 42 and the third region 43, the etching surface of the anisotropic etching has not arrived at the sacrificial layer 15. Contours of the non-through holes 31 before the start of the etching are represented by the dotted line in FIG. 18B. In this case, the depth of the non-through holes 32 in the second region 42 is larger than that of the non-through holes 33 in the third region 43, and hence the anisotropic etching in the thickness direction of the silicon substrate 10 proceeds faster in the second region 42 as compared to the third region 43. FIG. 18C is an illustration of a state in which the anisotropic etching is performed further for about 5 hours after the state illustrated in FIG. 18B. In the state illustrated in FIG. 18C, the etching surface of the anisotropic etching has arrived at the sacrificial layer 15 in any of the second region 42 and the third region 43, and the etching from the first surface 21 side (sacrificial layer 15 side) proceeds. The anisotropic etching proceeds from the second region 42 also in a direction perpendicular to the thickness direction of the silicon substrate 10, and a plurality of different crystal planes are formed in the thickness direction of the silicon substrate 10. This is because of the influence of the etching from the first surface 21 side in addition to the side etching from the second region 42. With this, the beam 51 is formed in the first region 41 in contact with the oxide film 4.

Figure 18D:
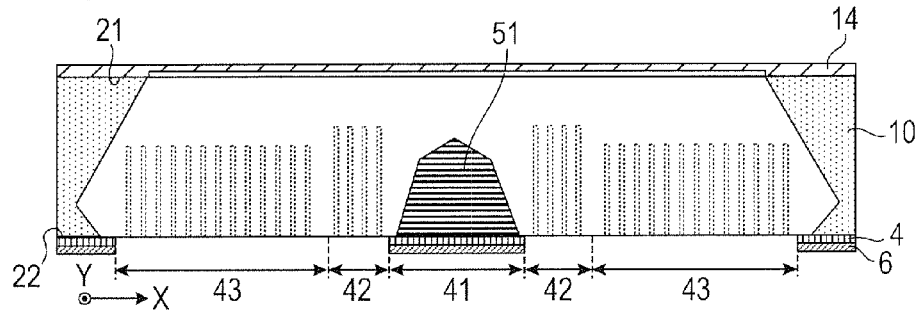

FIG. 18D is an illustration of a state in which the anisotropic etching is performed further for about 2 hours after the state illustrated in FIG. 18C. In the state illustrated in FIG. 18D, the etching from the first surface 21 side (sacrificial layer 15 side) further proceeds in addition to the side etching from the second region 42, and thus the beam 51 becomes smaller while being held in contact with the oxide film 4. FIG. 19A is an illustration of a state after the anisotropic etching is performed further for about 1 hour, and the supply path 13 and the beam 51 thus formed are illustrated. In this case, a sectional shape of the beam 51 is a pentagon, and the beam 51 extends in the Y direction in the supply path 13 so as to connect opposed sides (sides extending in the X direction in this case) of the supply path 13. FIG. 19B is an illustration of a portion surrounded by the dot-and-dash line in FIG. 19A in an enlarged manner. The reason that the cross-section of the beam 51 becomes a pentagon is that the etching further proceeds from the state illustrated in FIG. 18D while the beam 51 is held in contact with the oxide film 4 serving as the etching mask, and the etching speed on a surface in which the etching speed is high is limited. As illustrated in FIG. 19B, an angle $\alpha_4$ formed by a surface of the beam 51 closest to the first surface 21 and a plane parallel to the first surface 21 was about 25°. From this, it can be confirmed that the beam 51 is formed of a surface different from a Si(111) plane under beam forming conditions of Embodiment 10. The final shape of the beam 51 to be formed is determined by the dimension in the X direction of the first region 41 in which the oxide film 4 and the protective film 6 are formed, the plane orientation and the material of the silicon substrate 10, the anisotropic etching conditions, and the like. That is, the shape of the beam 51 can be adjusted by changing the elements described above, and the sectional shape of the beam 51 can also be set to a triangle. Further, the position of an apex closest to the first surface 21 in the sectional shape of the beam 51 is retracted toward the second surface 22 from the surface position of the first surface 21. After this, when the passivation layer 14 is removed in accordance with the forming position of the supply path 13, the supply path 13 that penetrates through the silicon substrate 10 and is configured to supply a liquid from the second surface 22 side to the first surface side is completed, with the result that the substrate for a liquid ejection head is completed.

In Embodiment 10, the dimension in the cross-section in the X direction of the beam 51 formed in the supply path 13 is defined as illustrated in FIG. 19A and FIG. 19B. The shortest distance between the surface position of the first surface 21 and the beam 51 in the thickness direction of the silicon substrate 10 is defined as a beam depth $D_4$. The longest distance of the beam 51 in the thickness direction of the silicon substrate 10 is defined as a beam height $H_4$. The longest distance of the beam 51 in a direction (X direction) perpendicular to the thickness direction of the silicon substrate 10 is defined as a beam width $W_4$. It is preferred that the beam depth $D_4$ be set to 50 μm or more in the application of the substrate for a liquid ejection head from the viewpoint of the ejection function such as refill characteristics at time of ejection of a liquid from the ejection orifices 11. It is preferred that the beam height $H_4$ and the beam width $W_4$ be set to 100 μm or more from the viewpoint of the enhancement of reliability such as mechanical strength of the liquid ejection head 1. It is necessary to determine the dimension of the beam 51 in further consideration of the characteristics, such as the influence of the dissolution of silicon into a liquid that is to be actually ejected from a liquid ejection head, the expected age of service of the liquid ejection head, and the like. FIG. 19C is a plan view of the silicon substrate 10 illustrated in FIG. 19A viewed from the second surface 22 side.

Embodiment 11

Figure 20A:
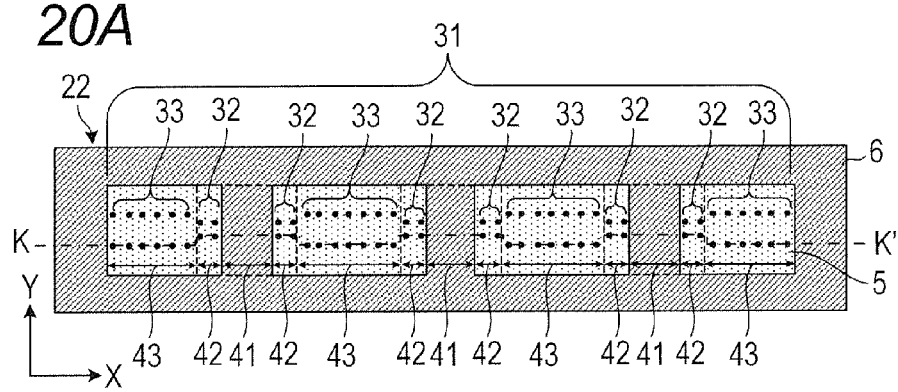
FIGS. 20A and 20D are each a plan view of a second surface of a silicon substrate for illustrating a forming process of a supply path and a beam in Embodiment 11 of the present invention.
Figure 20B:
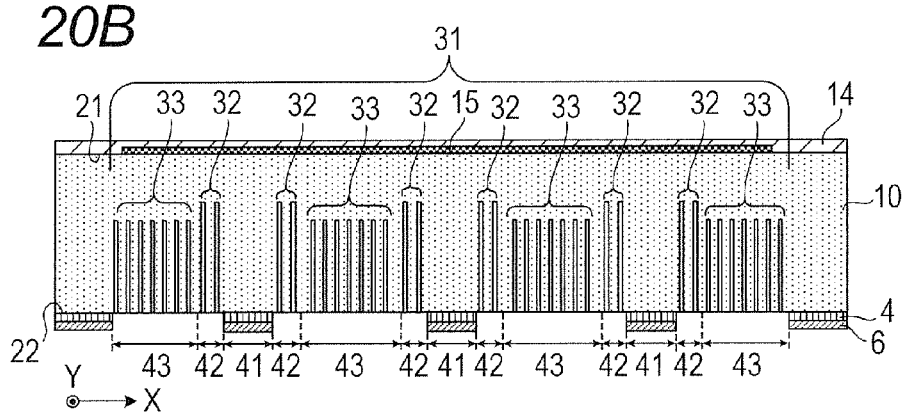
FIGS. 20B and 20C are each a sectional view thereof.
Figure 20C:
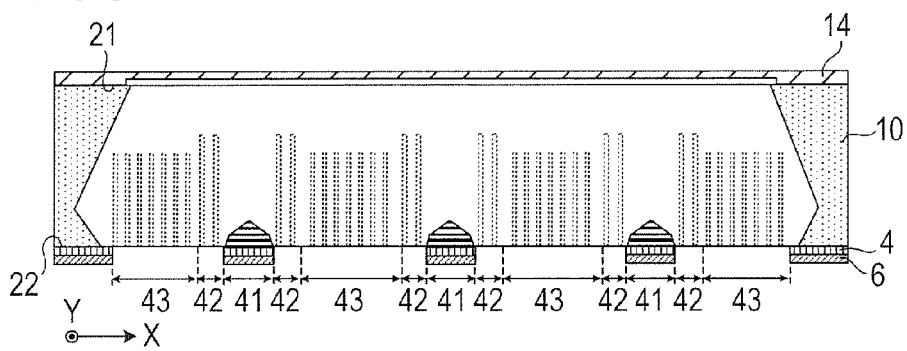
Figure 20D:
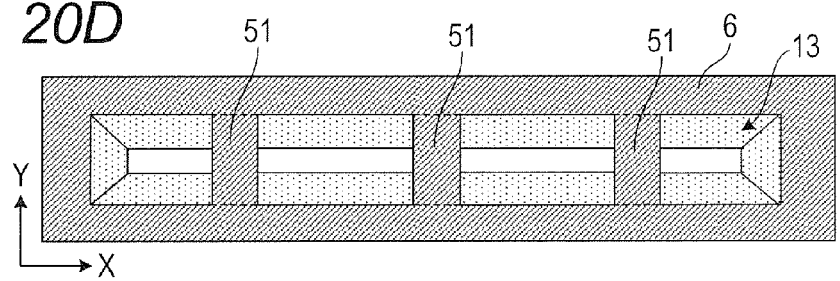

In Embodiment 10 described above, one first region 41 serving as the beam forming region is set in the single supply path forming region, and the second regions 42 are respectively set on both sides of the first region 41. In this case, in the case where the first region 41 and the second regions 42 on both sides of the first region 41 are considered as one group, a plurality of such groups may also be set in the single supply path forming region. That is, a plurality of beams 51 may also be provided in the supply path 13. Embodiment 11 is similar to Embodiment 10, but Embodiment 11 is different from Embodiment 10 in that three beams 51 are provided in the supply path 13. FIG. 20A to FIG. 20D are each a view for illustrating the forming process of the supply path 13 and the beams 51 in Embodiment 11. FIG. 20A and FIG. 20B are each a view for illustrating a state after the non-through hole forming step is completed and before the etching step is started in the same manner as in FIG. 17B and FIG. 18A of Embodiment 10. The figures described above are illustrations of the arrangement of the non-through holes 32 in the second region 42 and the arrangement of the non-through holes 33 in the third region 43. FIG. 20B is a sectional view taken along the line K-K' of FIG. 20A. FIG. 20C is a sectional view for illustrating a state after the anisotropic etching is completed, and FIG. 20D is a plan view of the silicon substrate 10 illustrated in FIG. 20C viewed from the second surface 22 side. Embodiment 11 is the same as Embodiment with the exception that three first regions 41 are provided in the supply path forming region, and that the second regions are respectively disposed on both sides of each of the first regions 41. Thus, the forming idea and forming method of the supply path 13 and the beams 51 in Embodiment 11 are the same as those of Embodiment 10, and two or four or more beams 51 may also be formed.

Embodiment 12

Figure 21A:
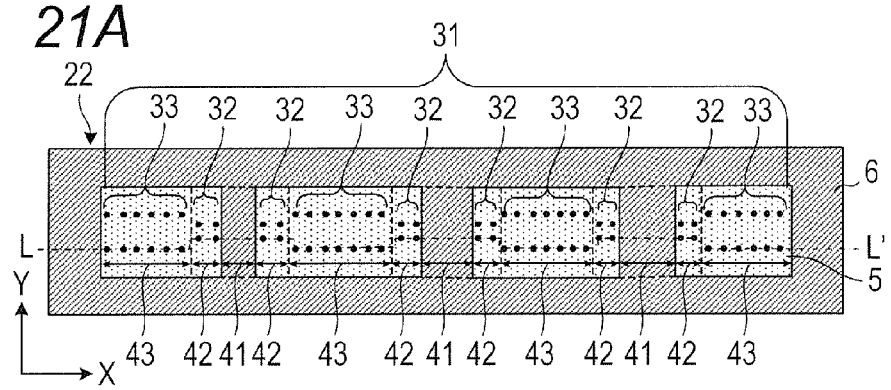
FIGS. 21A and 21D are each a plan view of a second surface of a silicon substrate for illustrating a forming process of a supply path and a beam in Embodiment 12 of the present invention.
Figure 21B:
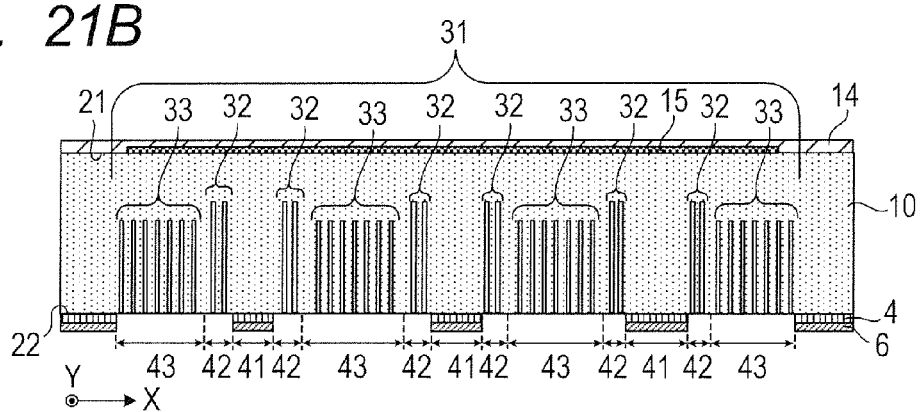
FIGS. 21B and 21C are each a sectional view thereof.
Figure 21C:
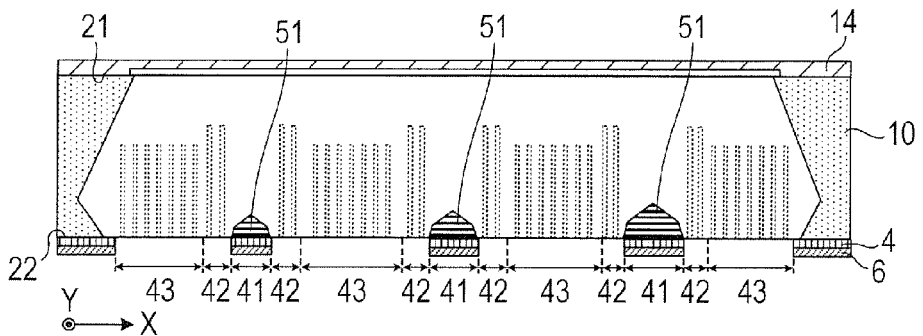
Figure 21D:
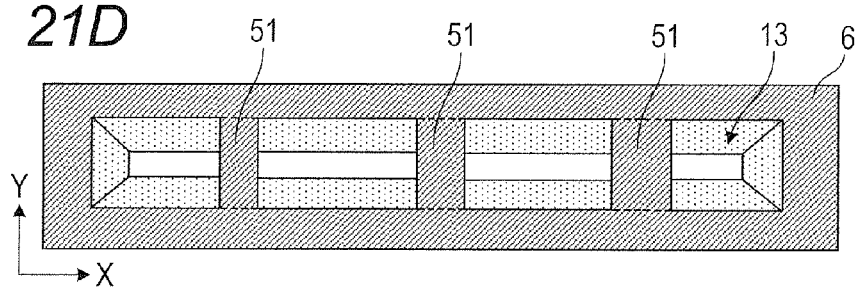

In the case where the first region 41 and the second regions 42 on both sides of the first region 41 are considered as one group, and a plurality of such groups are set in the single supply path forming region, different dimensions in the longitudinal direction (X direction) of the supply path forming region can be set with respect to each group of the first region 41 and the second regions 42. That is, a plurality of beams 51 having different dimensions and shapes can be formed in the supply path 13. In Embodiment 12, three beams 51 are provided in the supply path 13 in the same manner as in Embodiment 11, but Embodiment 12 is different from Embodiment 11 in that the dimensions and the shapes of the respective beams 51 are different from each other. FIG. 21A to FIG. 21D are each a view for illustrating a forming process of the supply path 13 and the beams 51 in Embodiment 12. FIG. 21A and FIG. 21B are each a view for illustrating a state after the non-through hole forming step is completed and before the etching step is started and for illustrating the arrangement of the non-through holes 32 in the second region 42 and the arrangement of the non-through holes 33 in the third region 43. FIG. 21B is a sectional view taken along the line L-L' of FIG. 21A. FIG. 21C is a sectional view for illustrating a state after the anisotropic etching is completed, and FIG. 21D is a plan view of the silicon substrate 10 illustrated in FIG. 21C viewed from the second surface 22 side. The forming idea and forming method of the supply path 13 and the beams 51 in Embodiment 12 are the same as those of Embodiments 10 and 11, and two or four or more beams 51 may also be formed. In this embodiment, at least two beams 51 are provided in the supply path 13, and at least one of the beams 51 can be made different in at least one of a dimension or a shape from another beam 51 in the supply path 13.

The present invention has been described by means of exemplary embodiments so far. However, the present invention is not limited to those embodiments. The present invention can be modified and changed variously within the scope and the gist thereof.

EXAMPLES

Example 1

An example in which the supply path 13 is processed onto the silicon substrate 10 based on Embodiment 1 described above is described as Example 1. The silicon substrate 10 having a plane orientation of (100) and a thickness of about 725 μm was used. The dimension of the opening 5 in the X direction (longitudinal direction) was set to 25 mm, and the dimension of the opening 5 in the Y direction was set to 750 μm. The dimensions of the first region 41, the second region 42, and the third region 43 in the X direction and the arrangement of the non-through holes 31 were set as described below.

The dimension of the first region 41 in the X direction was set to 1,380 μm, and the dimension of each second region 42 in the X direction was set to 420 μm. Thus, the dimension of each third region 43 in the X direction was 11.39 mm. The non-through holes 31 were not processed in the first region 41. In the second region 42, three rows of the non-through holes 32 along the X direction were arranged symmetrically with respect to a center line of the opening 5, and six non-through holes 32 were formed in each of the rows. The arrangement interval of the non-through holes 32 was set to 60 μm in each of the X direction and the Y direction. In the third region 43, two rows of the non-through holes 33 along the X direction were arranged symmetrically with respect to a center line of the opening 5. The arrangement interval of the non-through holes 33 was set to 120 μm in each of the X direction and the Y direction. The non-through holes 32 and 33 were respectively formed by laser processing so as to have a depth of about 645 μm and a diameter of about 10 μm.

In the anisotropic etching, a TMAH aqueous solution having a concentration of 22 mass % was used. The liquid temperature of the etching was set to 80° C., and the etching time was set to 8.5 hours.

When the supply path 13 was processed onto the silicon substrate 10 under the conditions described above, the beam 51 formed in the supply path 13 had a beam depth $D_1$ of about 100 μm, a beam height $H_1$ of about 250 μm, and a beam width $W_1$ of about 600 μm.

Example 2

It was verified how the shape of the beam 51 (beam depth $D_1$, beam width $W_1$) was changed when the dimension of the first region 41 in the longitudinal direction (X direction) and the anisotropic etching time were changed. In Example 2, the silicon substrate 10 was processed with the dimension of the first region 41 in the X direction in Example 1 being set to 900 μm and 1,680 μm, in addition to Example 1 described above. The dimension of the second region 42 in the X direction and the dimension of the opening 5 in the X direction were not changed. Thus, the conditions were the same as those of Example 1 except the dimension of the first region 41 in the X direction and the dimension of the third region 43 in the X direction. The anisotropic etching time was changed in 1 hour increments within a range of from 5.5 hours to 9.5 hours. Then, in the processed silicon substrate 10, the shape of the beam 51 formed in the supply path 13 (beam depth D (μm) and beam width W (μm)) were checked.

In order to find a relationship between the anisotropic etching time and the beam shape, the anisotropic etching time T was plotted on the horizontal axis, and the shape of the beam 51 (beam depth D, beam width W) was plotted on the vertical axis for each of silicon substrates having different dimensions of the first region 41 in the X direction, followed by linear approximation. When the linear approximation was used with respect to the relationship between the beam depth D and the anisotropic etching time T, the following expression (7) was able to be obtained. A coefficient $a_1$ (μm/hour) and a coefficient $b_1$ (μm/hour) in the expression (7) are as shown in Table 1 below. The application range of the expression (7) is D>0, that is, the case where the beam 51 is formed at a position retracted from the first surface 21 of the silicon substrate 10 to the second surface 22 thereof.

$$D = a_1 \times T + b_1 \quad (7)$$

From the expression (7), it is understood that the beam depth D under the condition of D>0 changes by from about 1.3 µm/min to about 1.6 µm/min in terms of unit minute with respect to the anisotropic etching time.

TABLE 1

| Dimension of first region in X direction (µm) | Coefficient (µm/hour) | | Application range of expression (7) |
|---|---|---|---|
| | $a_1$ | $b_1$ | |
| 900 | 93.0 | −574.2 | D > 0 |
| 1,380 | 77.5 | −563.8 | D > 0 |
| 1,620 | 91.0 | −730.5 | D > 0 |

When the linear approximation was used with respect to the relationship between the beam width W and the anisotropic etching time T, the following expression (8) was able to be obtained. A coefficient $a_2$ (µm/hour) and a coefficient $b_2$ (µm/hour) in the expression (8) are as shown in Table 2 below. The application range of the expression (8) is W>0, that is, a range in which the beam 51 is not eliminated by the anisotropic etching.

$$W = a_2 \times T + b_2 \quad (8)$$

From the expression (8), it is understood that the beam width W under the condition of W>0 changes by from about −3.2 µm/min to about −3.6 µm/min in terms of unit minute with respect to the anisotropic etching time. That is, a change in beam width on one side becomes a half of the above-mentioned change to be from about −1.6 µm/min to about −1.8 µm/min. The dimension of the beam 51 is not limited to the results of Example 2, and may be variously changed by changing each of the regions 41 to 43 of the opening 5 in the second surface 22 of the silicon substrate 10, the anisotropic etching conditions, and the like.

TABLE 2

| Longitudinal dimension of first region (µm) | Coefficient (µm/hour) | | Application range of expression (8) |
|---|---|---|---|
| | $a_2$ | $b_2$ | |
| 900 | −195.9 | 1,730.6 | W > 0 |
| 1,380 | −215.7 | 2,382.6 | W > 0 |
| 1,620 | −213.1 | 2,600.3 | W > 0 |

Example 3

An example in which the supply path 13 is processed onto the silicon substrate 10 based on Embodiment 4 described above is described as Example 3. The silicon substrate 10 having a plane orientation of (100) and a thickness of about 725 µm was used. The dimension of a supply path forming region in the X direction (longitudinal direction) was set to 25 mm, and the dimension of the supply path forming region in the Y direction was set to 750 µm. The dimensions of the first region 41, the second region 42, and the third region 43 in the X direction and the arrangement of the non-through holes 31 were set as described below.

The dimension of the first region 41, which was covered with the protective film 6 and the oxide film 4 serving as an etching mask, in the X direction was set to 1,080 µm, and the dimension of each second region 42 in the X direction was set to 360 µm. Thus, the dimension of each third region 43 in the X direction was 11.6 mm. In the second region 42, three rows of the non-through holes 32 along the X direction were arranged symmetrically with respect to a center line of the opening 5, and six non-through holes 32 were formed in each of the rows. The arrangement interval of the non-through holes 32 was set to 60 µm in each of the X direction and the Y direction. In the third region 43, two rows of the non-through holes 33 along the X direction were arranged symmetrically with respect to a center line of the opening 5. The arrangement interval of the non-through holes 33 was set to 120 µm in each of the X direction and the Y direction. The non-through holes 32 and 33 were respectively formed by laser processing so as to have a depth of about 645 µm and a diameter of about 10 µm.

In the anisotropic etching, a TMAH aqueous solution having a concentration of 22 mass % was used. The liquid temperature of the etching was set to 80° C., and the etching time was set to 10.5 hours.

When the supply path 13 was processed onto the silicon substrate 10 under the conditions described above, the beam 51 formed in the supply path 13 had a beam depth $D_2$ of about 350 µm, a beam height $H_2$ of about 370 µm, and a beam width $W_2$ of about 890 µm.

Example 4

An example in which the supply path 13 is processed onto the silicon substrate 10 based on Embodiment 7 described above is described as Example 4. The silicon substrate 10 having a plane orientation of (100) and a thickness of about 725 µm was used. The dimension of the opening 5 in the X direction (longitudinal direction) was set to 25 mm, and the dimension of the opening 5 in the Y direction was set to 750 µm. The dimensions of the first region 41, the second region 42, and the third region 43 in the X direction and the arrangement of the non-through holes 31 were set as described below.

The dimension of the first region 41 in the X direction was set to 1,380 µm, and the dimension of each second region 42 in the X direction was set to 420 µm. Thus, the dimension of each third region 43 in the X direction was 11.39 mm. The non-through holes 31 were not processed in the first region 41. In the second region 42, two rows of the non-through holes 32 along the X direction were arranged symmetrically with respect to a center line of the opening 5, and the arrangement interval between the non-through holes 32 was set to 60 µm in each of the X direction and the Y direction. The depth of the non-through holes 32 was set to about 645 µm, and the diameter thereof was set to about 10 µm. In the third region 43, two rows of the non-through holes 33 along the X direction were arranged symmetrically with respect to a center line of the opening 5. The arrangement interval of the non-through holes 33 was set to 60 µm in the X direction and to 120 µm in the Y direction. The depth of the non-through holes 33 was set to about 600 µm, and the diameter thereof was set to about 10 µm.

In the anisotropic etching, a TMAH aqueous solution having a concentration of 22 mass % was used. The liquid temperature of the etching was set to 80° C., and the etching time was set to 8.5 hours.

When the supply path 13 was processed onto the silicon substrate 10 under the conditions described above, the beam 51 formed in the supply path 13 had a beam depth $D_3$ of about 100 µm, a beam height $H_3$ of about 250 µm, and a beam width $W_3$ of about 600 µm.

Example 5

An example in which the supply path 13 is processed onto the silicon substrate 10 based on Embodiment 10 described above is described as Example 5. The silicon substrate 10 having a plane orientation of (100) and a thickness of about 725 μm was used. The dimension of the supply path forming region in the X direction (longitudinal direction) was set to 25 mm, and the dimension of the supply path forming region in the Y direction was set to 750 μm. The dimensions of the first region 41, the second region 42, and the third region 43 in the X direction and the arrangement of the non-through holes 31 were set as described below.

The dimension of the first region 41, which was covered with the protective film 6 and the oxide film 4 serving as an etching mask, in the X direction was set to 1,080 μm, and the dimension of each second region 42 in the X direction was set to 360 μm. Thus, the dimension of each third region 43 in the X direction was 11.6 mm. In the second region 42, two rows of the non-through holes 32 along the X direction were arranged symmetrically with respect to a center line of the opening 5, and the arrangement interval between the non-through holes 32 was set to 60 μm in each of the X direction and the Y direction. The depth of the non-through holes 32 was set to about 645 μm, and the diameter thereof was set to about 10 μm. In the third region 43, two rows of the non-through holes 33 along the X direction were arranged symmetrically with respect to a center line of the opening 5. The arrangement interval of the non-through holes 33 was set to 60 μm in the X direction and to 120 μm in the Y direction. The depth of the non-through holes 33 was set to about 600 μm, and the diameter thereof was set to about 10 μm.

In the anisotropic etching, a TMAH aqueous solution having a concentration of 22 mass % was used. The liquid temperature of the etching was set to 80° C., and the etching time was set to 10.5 hours.

When the supply path 13 was processed onto the silicon substrate 10 under the conditions described above, the beam 51 formed in the supply path 13 had a beam depth $D_4$ of about 350 μm, a beam height $H_4$ of about 370 μm, and a beam width $W_4$ of about 890 μm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-128627, filed Jun. 26, 2015, which is hereby incorporated by reference herein in its entirety.

What is claimed is:

1. A method of processing a silicon substrate, comprising forming a supply path in a silicon substrate having a first surface and a second surface on an opposite side of the first surface, the supply path penetrating the silicon substrate and including a beam configured to connect opposed sides of the supply path to each other, the method further comprising:
a non-through hole forming step of partitioning, for each beam, a region of the second surface in which the supply path is to be formed, into a first region that corresponds to a forming position of the beam, a second region that is adjacent to the first region on both sides of the first region, and a third region that is none of the first region and the second region, and forming a plurality of non-through holes, which are prevented from penetrating the silicon substrate, in the second region and the third region with a predetermined depth from the second surface; and
an etching step of subjecting the silicon substrate having the plurality of non-through holes formed therein, to anisotropic etching from the second surface, to thereby form the supply path and the beam in the supply path, the non-through hole forming step comprising causing at least one of an interval or a depth of each of the plurality of non-through holes to differ in the second region and the third region.

2. The method of processing a silicon substrate according to claim 1, wherein the beam is formed so that a position of an apex closest to the first surface in a sectional shape of the beam is retracted toward the second surface from a surface position of the first surface.

3. The method of processing a silicon substrate according to claim 1, wherein the non-through hole forming step comprises causing the interval of the plurality of non-through holes in the second region to be smaller than the interval of the plurality of non-through holes in the third region.

4. The method of processing a silicon substrate according to claim 1, wherein the non-through hole forming step comprises causing the depth of the plurality of non-through holes in the second region to be larger than the depth of the plurality of non-through holes in the third region.

5. The method of processing a silicon substrate according to claim 1, wherein the etching step comprises removing a sacrificial layer formed on the silicon substrate in a region of the first surface corresponding to a position at which the supply path is to be formed.

6. The method of processing a silicon substrate according to claim 1, wherein the silicon substrate has an oxide film formed on the second surface except the region in which the supply path is to be formed, and the oxide film is used as an etching mask in the etching step.

7. The method of processing a silicon substrate according to claim 1, wherein the silicon substrate has an oxide film formed on the second surface except the second region and the third region, and the oxide film is used as an etching mask in the etching step.

8. The method of processing a silicon substrate according to claim 1, wherein at least two beams are formed in the supply path, and at least one of the beams is different in at least one of a dimension or a shape from another beam in the supply path.

9. A method of manufacturing a substrate for a liquid ejection head, comprising forming a supply path in a silicon substrate having a first surface and a second surface on an opposite side of the first surface and having a plurality of energy generating elements formed on the first surface, the supply path penetrating the silicon substrate and including a beam configured to connect opposed sides of the supply path to each other, the method further comprising:
a non-through hole forming step of partitioning, for each beam, a region of the second surface in which the supply path is to be formed, into a first region that corresponds to a forming position of the beam, a second region that is adjacent to the first region on both sides of the first region, and a third region that is none of the first region and the second region, and forming a plurality of non-through holes, which are prevented from penetrating the silicon substrate, in the second region and the third region with a predetermined depth from the second surface; and
an etching step of subjecting the silicon substrate having the plurality of non-through holes formed therein, to anisotropic etching from the second surface, to thereby form the supply path and the beam in the supply path, the non-through hole forming step comprising causing at least one of an interval or a depth of each of the plurality of non-through holes to differ in the second region and the third region.

10. The method of manufacturing a substrate for a liquid ejection head according to claim 9, wherein the beam is formed so that a position of an apex closest to the first surface in a sectional shape of the beam is retracted toward the second surface from a surface position of the first surface.

11. The method of manufacturing a substrate for a liquid ejection head according to claim 9, wherein the non-through hole forming step comprises causing the interval of the plurality of non-through holes in the second region to be smaller than the interval of the plurality of non-through holes in the third region.

12. The method of manufacturing a substrate for a liquid ejection head according to claim 9, wherein the non-through hole forming step comprises causing the depth of the plurality of non-through holes in the second region to be larger than the depth of the plurality of non-through holes in the third region.

13. The method of manufacturing a substrate for a liquid ejection head according to claim 9, wherein the etching step comprises removing a sacrificial layer formed on the silicon substrate in a region of the first surface corresponding to a position at which the supply path is to be formed.

14. The method of manufacturing a substrate for a liquid ejection head according to claim 9, wherein the silicon substrate has an oxide film formed on the second surface except the region in which the supply path is to be formed, and the oxide film is used as an etching mask in the etching step.

15. The method of manufacturing a substrate for a liquid ejection head according to claim 9, wherein the silicon substrate has an oxide film formed on the second surface except the second region and the third region, and the oxide film is used as an etching mask in the etching step.

16. The method of manufacturing a substrate for a liquid ejection head according to claim 9, wherein at least two beams are formed in the supply path, and at least one of the beams is different in at least one of a dimension or a shape from another beam in the supply path.

* * * * *